United States Patent
Lin et al.

(10) Patent No.: US 9,711,079 B2
(45) Date of Patent: Jul. 18, 2017

(54) SHIFT REGISTER PULLING CONTROL SIGNALS ACCORDING TO DISPLAY MODE

(71) Applicant: AU Optronics Corp., Hsin-Chu (TW)

(72) Inventors: Wei-Li Lin, Hsin-Chu (TW); Che-Wei Tung, Hsin-Chu (TW); Chia-Heng Chen, Hsin-Chu (TW)

(73) Assignee: AU OPTRONICS CORP., Hsin-Chu (TW)

(*) Notice: Subject to any disclaimer, the term of this patent is extended or adjusted under 35 U.S.C. 154(b) by 113 days.

(21) Appl. No.: 14/818,321

(22) Filed: Aug. 5, 2015

(65) Prior Publication Data

US 2016/0275853 A1   Sep. 22, 2016

(30) Foreign Application Priority Data

Mar. 19, 2015 (TW) .............................. 104108816 A

(51) Int. Cl.
    *G11C 19/28* (2006.01)
    *G09G 3/20* (2006.01)
    *G09G 3/00* (2006.01)

(52) U.S. Cl.
    CPC .......... *G09G 3/2096* (2013.01); *G09G 3/003* (2013.01); *G11C 19/28* (2013.01); *G09G 2310/0286* (2013.01); *G09G 2320/08* (2013.01)

(58) Field of Classification Search
    None
    See application file for complete search history.

(56) References Cited

U.S. PATENT DOCUMENTS

| 7,817,771 B2* | 10/2010 | Tsai ................. G11C 19/28 377/64 |
| 8,396,183 B2* | 3/2013 | Yang ................. G09G 3/20 377/64 |
| 2010/0002827 A1 | 1/2010 | Shih et al. |
| 2010/0150303 A1* | 6/2010 | Tsai ................. G11C 19/28 377/79 |
| 2010/0260312 A1 | 10/2010 | Tsai et al. |

(Continued)

FOREIGN PATENT DOCUMENTS

| TW | I387801 | 3/2013 |
| TW | I400686 | 7/2013 |
| TW | I413965 | 11/2013 |

*Primary Examiner* — Tuan T Lam
(74) *Attorney, Agent, or Firm* — Locke Lord LLP; Tim Tingkang Xia, Esq.

(57) ABSTRACT

A shift register includes a first voltage stabilizing unit, a second voltage stabilizing unit, a main pull-down unit and a main pull-up unit. The first voltage stabilizing unit is used to pull a first driving control signal to a low voltage terminal when a first stabilizing control signal is high. The second voltage stabilizing unit is used to pull the first driving control signal to the low voltage terminal when a second stabilizing control signal is high. The main pull-down unit includes a first sub-pull-down unit controlled by a second gate-terminal signal for pulling down the first driving control signal to the low voltage terminal during a first display mode, and a second sub-pull-down unit controlled by a third gate-terminal signal for pulling down the first driving control signal to the low voltage terminal during a second display mode. The main pull-up unit is used for pulling up a first gate-terminal signal.

12 Claims, 18 Drawing Sheets

(56) References Cited

U.S. PATENT DOCUMENTS

| | | | | |
|---|---|---|---|---|
| 2014/0355732 A1* | 12/2014 | Lin | ................... | G06F 3/041 377/64 |
| 2014/0372494 A1* | 12/2014 | Lin | ................... | G06F 5/08 708/209 |
| 2015/0049853 A1* | 2/2015 | Lin | ................... | G11C 19/28 377/64 |

* cited by examiner

SHIFT REGISTER PULLING CONTROL SIGNALS ACCORDING TO DISPLAY MODE

CROSS REFERENCE TO RELATED APPLICATION

This application claims priority to Taiwan Patent Application No. 104108816, filed Mar. 19, 2015, and incorporated herein by reference in its entirety.

BACKGROUND OF THE INVENTION

1. Field of the Invention

The present invention relates to a shift register, and more particularly, a shift register pulling control signals according to display mode.

2. Description of the Prior Art

FIG. 1 illustrates operation waveforms of a driving control signal Q(n) and gate-terminal signal signals G(n) to G(n+7) in a three-dimensional (3D) display mode according to the prior art. FIG. 2 illustrates operation waveforms of the driving control signal Q(n) and the gate-terminal signal signals G(n) to G(n+7) in a two-dimensional (2D) display mode according to the prior art.

According to FIG. 1, in the 3D display mode, the gate-terminal signals G(n) and G(n+1) are in phase at edges of pulses, the gate-terminal signals G(n+2) and G(n+3) are in phase, the gate-terminal signals G(n+4) and G(n+5) are in phase, and the gate-terminal signals G(n+6) and G(n+7) are in phase. The rising edges of the gate-terminal signals G(n+1), G(n+3), G(n+5) and G(n+7) are separated by 0.5 pulse-widths successively, so the rising edge of the gate-terminal signal G(n+6) is later than the falling edge of the gate-terminal signal G(n) by a 0.5 pulse-width. In a shift register of the prior art, the first driving control signal Q(n) is pulled up by charging a capacitor of a pull-up circuit when the gate-terminal signal G(n) rises, and the first driving control signal Q(n) is pulled down by a pull-down circuit controlled by the gate-terminal signal G(n+6) when the gate-terminal signal G(n+6) rises. Therefore, as shown in FIG. 1, the first driving control signal Q(n) rises 0.5 pulse-width before the pulse of the gate-terminal signal G(n) and falls 0.5 pulse-width after the pulse of the gate-terminal signal G(n) in the 3D display mode. The said pulse-width is a pulse-width of a clock waveform.

According to FIG. 2, in the 2D display mode, The rising edges of the gate-terminal signals G(n) to G(n+7) are separated by one pulse-width successively, that is to say, the falling edge of the gate-terminal signal G(n) is in phase with the rising edge of the gate-terminal signal G(n+1), the falling edge of the gate-terminal signal G(n+1) is in phase with the rising edge of the gate-terminal signal G(n+2), . . . and the falling edge of the gate-terminal signal G(n+6) is in phase with the rising edge of the gate-terminal signal G(n+7). As described above, in a shift register of the prior art, the first driving control signal Q(n) is pulled up by charging a capacitor of a pull-up circuit when the gate-terminal signal G(n) rises, and the first driving control signal Q(n) is pulled down by a pull-down circuit controlled by the gate-terminal signal G(n+6) when the gate-terminal signal G(n+6) rises. Therefore, as shown in FIG. 2, the first driving control signal Q(n) rises two pulse-widths before the pulse of the gate-terminal signal G(n) and falls five pulse-widths after the pulse of the gate-terminal signal G(n) in the 2D display mode.

As illustrated by FIG. 2, in the 2D display duration, the driving control signal Q(n) is of a high floating state in the duration t1. The five pulse-width duration of the high floating state is overlong and keeps the pull-up circuit turned on, so the gate-terminal signals are easily interfered by noise, and pixels may be turned on at wrong time points to cause abnormal display. In addition, since a stabilizing circuit is still turned off, external noise may likely cause the shift register to operate incorrectly.

SUMMARY OF THE INVENTION

An embodiment of the present invention discloses a shift register including a first voltage stabilizing unit, a second voltage stabilizing unit, a main pull-down unit and a main pull-up unit. The first voltage stabilizing unit includes a first pull-down control unit coupled to a low voltage terminal, a first stabilizing control signal source and a first driving control signal source, and a first pull-down unit coupled to the first pull-down control unit, the low voltage terminal, the first driving control signal source, a first gate-terminal signal source and a first setting signal source, and configured to pull a first gate-terminal signal, a first driving control signal and a first setting signal to the low voltage terminal when a first stabilizing control signal is of a high state. The second voltage stabilizing unit includes a second pull-down control unit coupled to the low voltage terminal, a second stabilizing control signal source and the first driving control signal source, and a second pull-down unit coupled to the second pull-down control unit, the low voltage terminal, the first driving control signal source, the first gate-terminal signal source and the first setting signal source, and configured to pull the first gate-terminal signal, the first driving control signal and the first setting signal to the low voltage terminal when a second stabilizing control signal is high, wherein the second stabilizing control signal and the first stabilizing control signal are in opposite phase. The main pull-down unit includes a first sub-pull-down unit coupled to a second gate-terminal signal source, the first driving control signal source and the low voltage terminal, and a second sub-pull-down unit coupled to a third gate-terminal signal source, the first driving control signal source and the low voltage terminal, wherein the first sub-pull-down unit is configured to be controlled by a second gate-terminal signal for pulling down the first driving control signal to the low voltage terminal in a first display mode, and the second sub-pull-down unit is configured to be controlled by a third gate-terminal signal for pulling down the first driving control signal to the low voltage terminal in a second display mode. The main pull-up unit includes a pull-up control unit coupled to a pulse signal source and the first driving control signal source, and a pull-up unit coupled to the pull-up control unit, the pulse signal source, the first gate-terminal signal source and the first driving control signal source, and configured to pull up the first gate-terminal signal.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
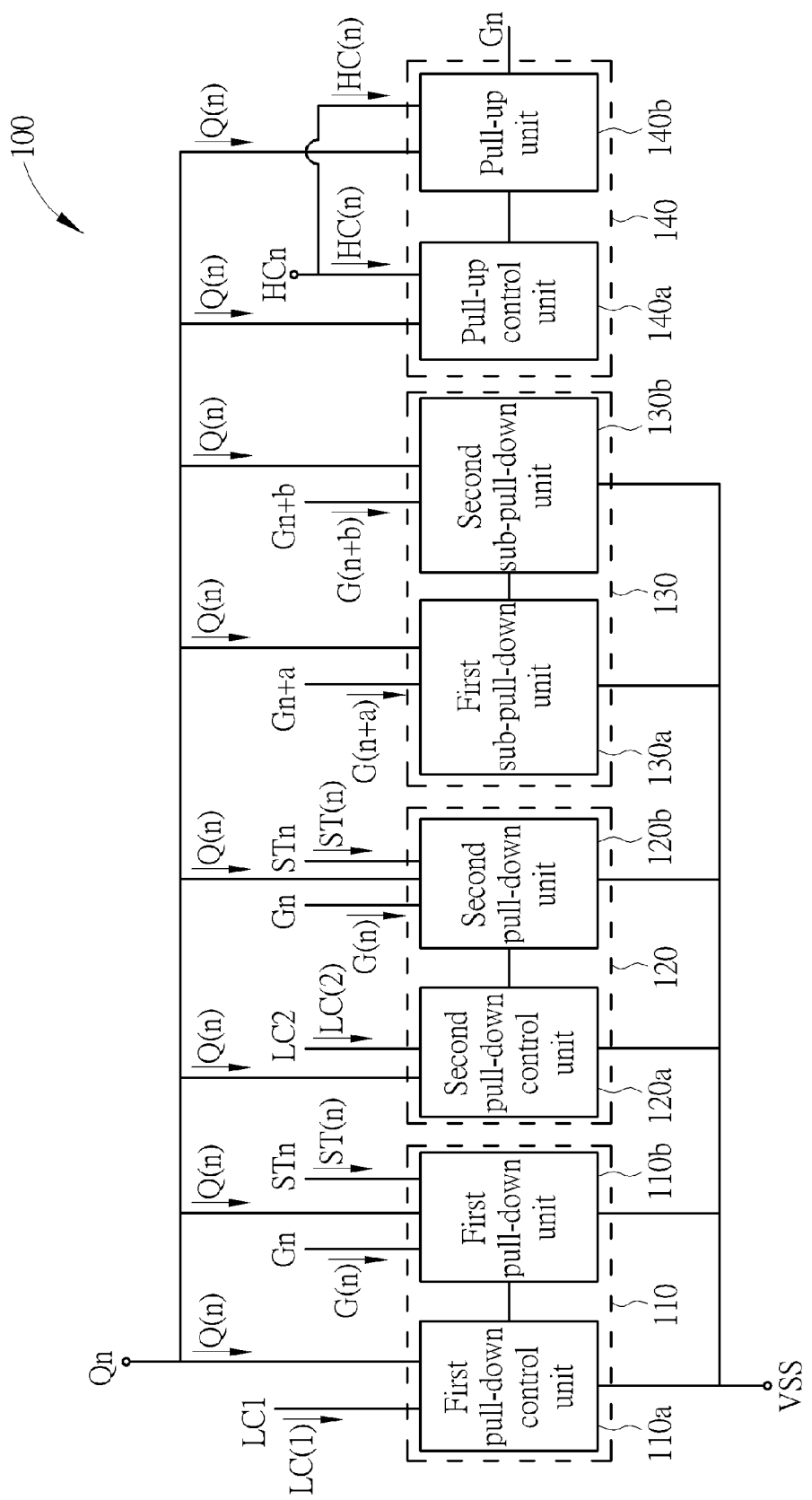
FIG. 3 illustrates a shift register according to an embodiment of the present invention.

FIG. 3 illustrates a shift register 100 according to an embodiment of the present invention. The shift register 100 includes a first voltage stabilizing unit 110, a second voltage stabilizing unit 120, a main pull-down unit 130 and a main pull-up unit 140. The first voltage stabilizing unit 110 includes a first pull-down control unit 110a and a first pull-down unit 110b. The first pull-down control unit 110a is coupled to a low voltage terminal VSS, a first stabilizing control signal source LC1 and a driving control signal source Q(n). The first pull-down unit 110b is coupled to the first pull-down control unit 110a, the low voltage terminal VSS, the driving control signal source Qn, a gate-terminal signal source Gn and a setting signal source STn. The first voltage stabilizing unit 110 is configured to pull a gate-terminal signal G(n), a driving control signal Q(n) and a setting signal ST(n) to the low voltage terminal VSS when a first stabilizing control signal LC(1) is of a high state. The second voltage stabilizing unit 120 includes a second pull-down control unit 120a and a second pull-down unit 120b.

The second pull-down control unit 120a is coupled to the low voltage terminal VSS, a second stabilizing control signal source LC2 and the driving control signal source Qn. The second pull-down unit 120b is coupled to the second pull-down control unit 120a, the low voltage terminal VSS, the driving control signal source Qn, the gate-terminal signal source Gn and the setting signal source STn. The second voltage stabilizing unit 120 is configured to pull the gate-terminal signal G(n), the driving control signal Q(n) and the setting signal ST(n) to the low voltage terminal VSS when a second stabilizing control signal LC(2) is high, wherein the second stabilizing control signal LC(2) and the first stabilizing control signal LC(1) are in opposite phase. The main pull-down unit 130 includes a first sub-pull-down unit 130a and a second sub-pull-down unit 130b. The first sub-pull-down unit 130a is coupled to a gate-terminal signal source Gn+a, the driving control signal source Qn and the low voltage terminal VSS. The second sub-pull-down unit 130b is coupled to a gate-terminal signal source Gn+b, the driving control signal source Qn and the low voltage terminal VSS, wherein the first sub-pull-down unit 130a is configured to be controlled by a gate-terminal signal G(n+a) for pulling down the driving control signal Q(n) to the low voltage terminal VSS in a first display mode, and the second sub-pull-down unit 130b is configured to be controlled by a gate-terminal signal G(n+b) for pulling down the driving control signal Q(n) to the low voltage terminal VSS in a second display mode. The main pull-up unit 140 includes a pull-up control unit 140a and a pull-up unit 140b. The pull-up control unit 140a is coupled to a pulse signal source HCn and the driving control signal source Qn for receiving a pulse signal HC(n) and the driving control signal Q(n). The pull-up unit 140b is coupled to the pull-up control unit 140a, the pulse signal source HCn, gate-terminal signal source Gn and the driving control signal source Qn and configured to pull up the gate-terminal signal G(n).

Figure 4:
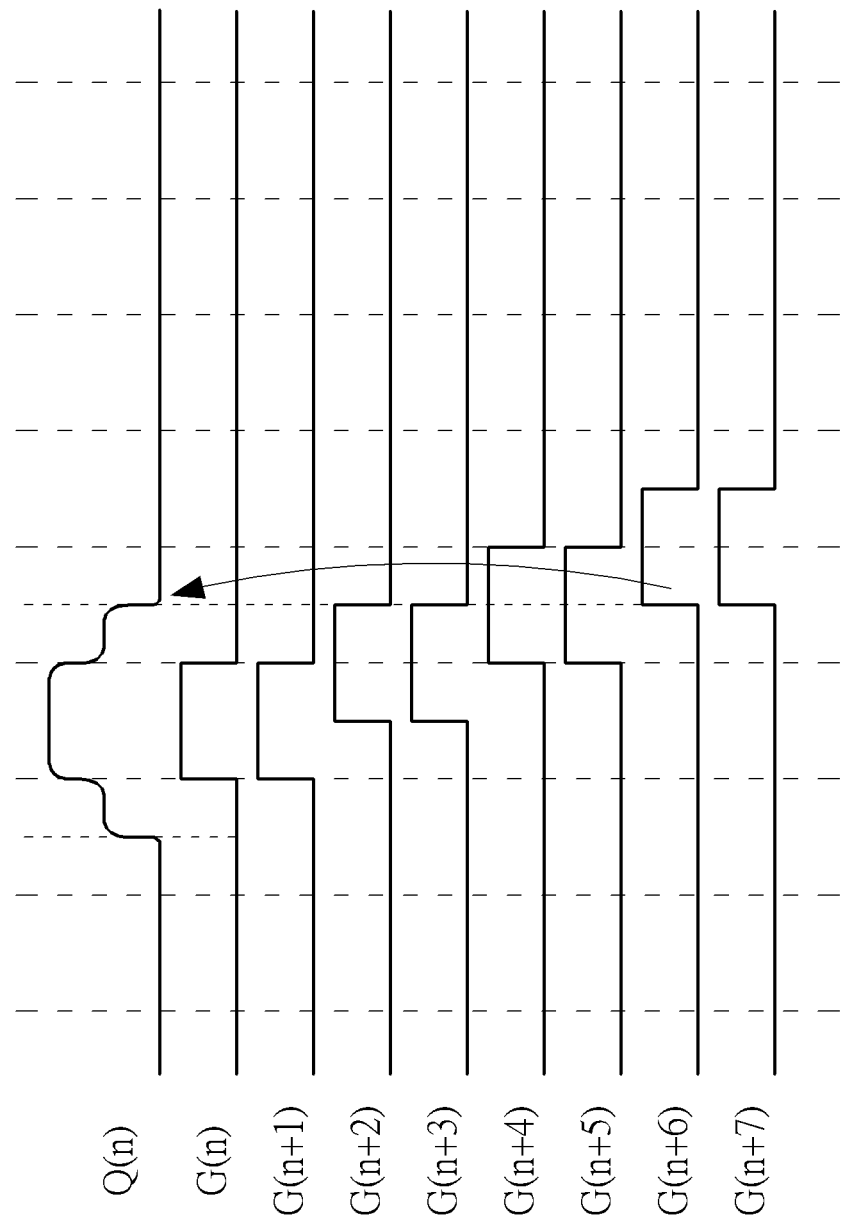
FIG. 4 illustrates a waveform diagram corresponding to the shift register shown in FIG. 3 in the second display mode.
Figure 5:
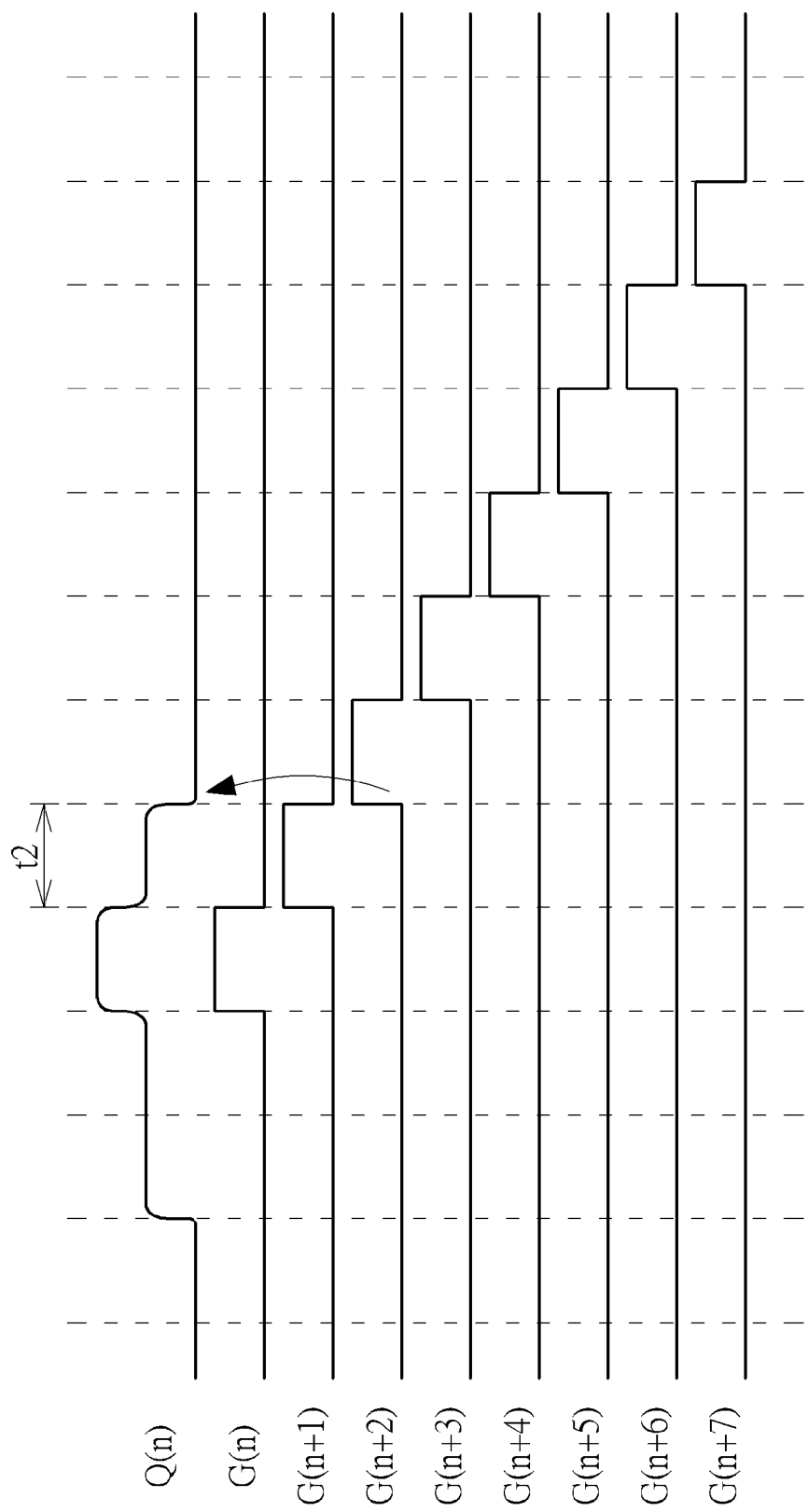
FIG. 5 illustrates another waveform diagram corresponding to the shift register shown in FIG. 3 in the first display mode.

FIG. 4 illustrates a waveform diagram corresponding to the shift register 100 shown in FIG. 3 in the second display mode. FIG. 5 illustrates another waveform diagram corresponding to the shift register 100 shown in FIG. 3 in the first display mode. It may be taken as an example to substitute 2 for the parameter a and substitute 6 for the parameter b. As described above and illustrated by FIG. 4, the second sub-pull-down unit 130b is configured to be controlled by a gate-terminal signal G(n+6) for pulling down the driving control signal Q(n) to the low voltage terminal VSS in the second display mode, so the driving control signal Q(n) rises 0.5 pulse-width before the rising edge of the gate-terminal signal G(n) in the second display mode. The driving control signal Q(n) rises to a higher level by a charging effect when being a high level pulse. The driving control signal Q(n) is pulled down to the low voltage terminal VSS by the gate-terminal signal G(n+6) 0.5 pulse-width after the falling edge of the gate-terminal signal G(n). As described above and illustrated by FIG. 5, the first sub-pull-down unit 130a is configured to be controlled by the gate-terminal signal G(n+2) for pulling down the driving control signal Q(n) to the low voltage terminal VSS in the first display mode, so the duration for the driving control signal Q(n) to be of the high floating state may be shrunk to be as long as one pulse-width such as the duration t2 shown in FIG. 5.

Figure 1:
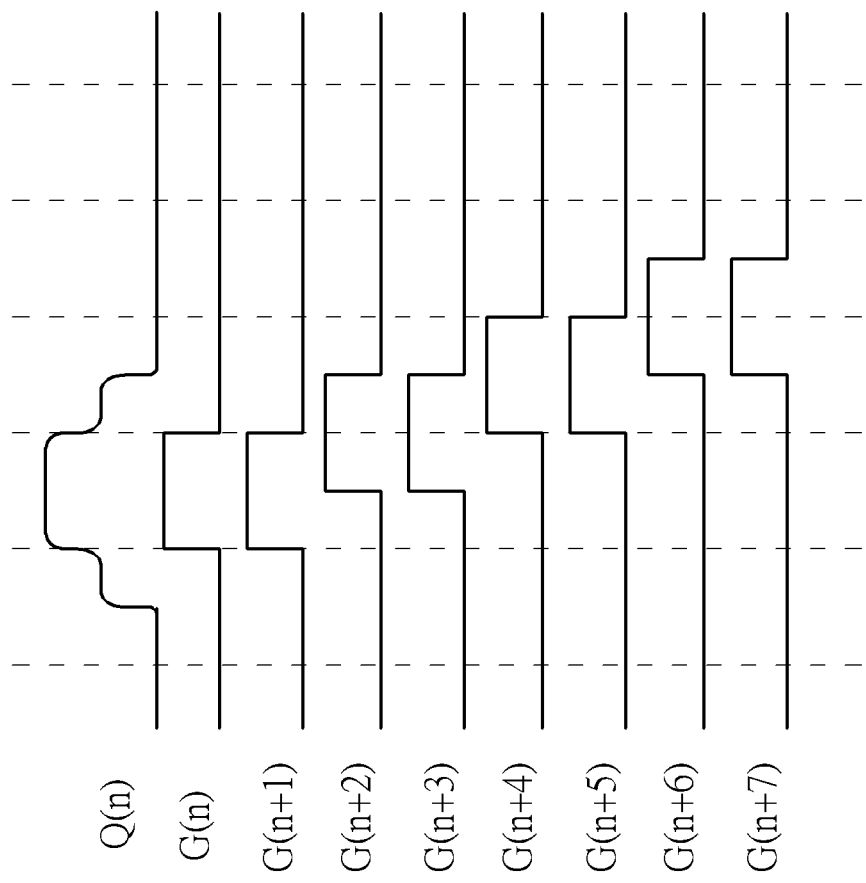
FIG. 1 illustrates operation waveforms of a driving control signal and gate-terminal signal signals in a second display mode according to the prior art.
Figure 2:
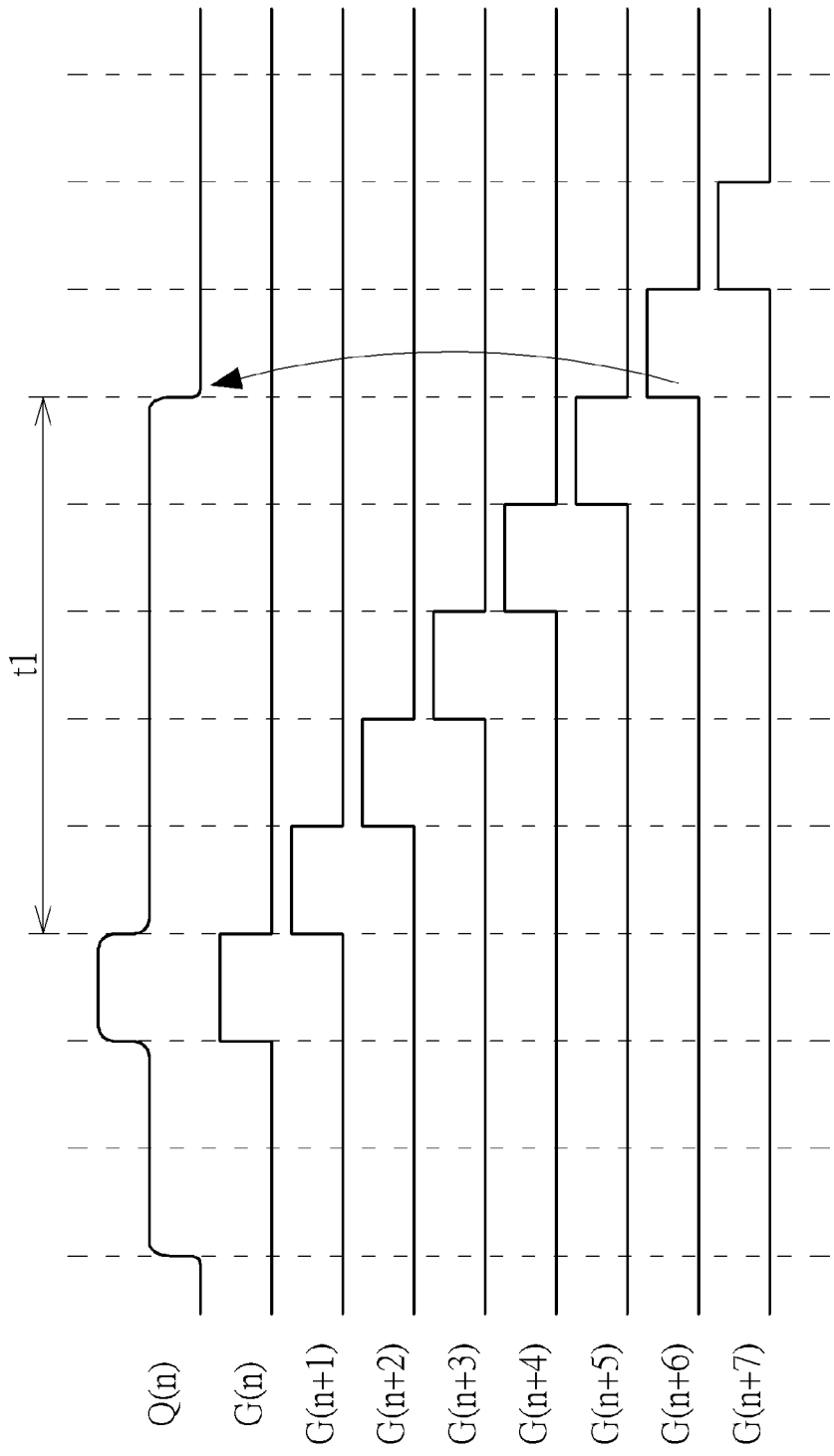
FIG. 2 illustrates operation waveforms of the driving control signal and the gate-terminal signal signals in a first display mode according to the prior art.
Figure 6:
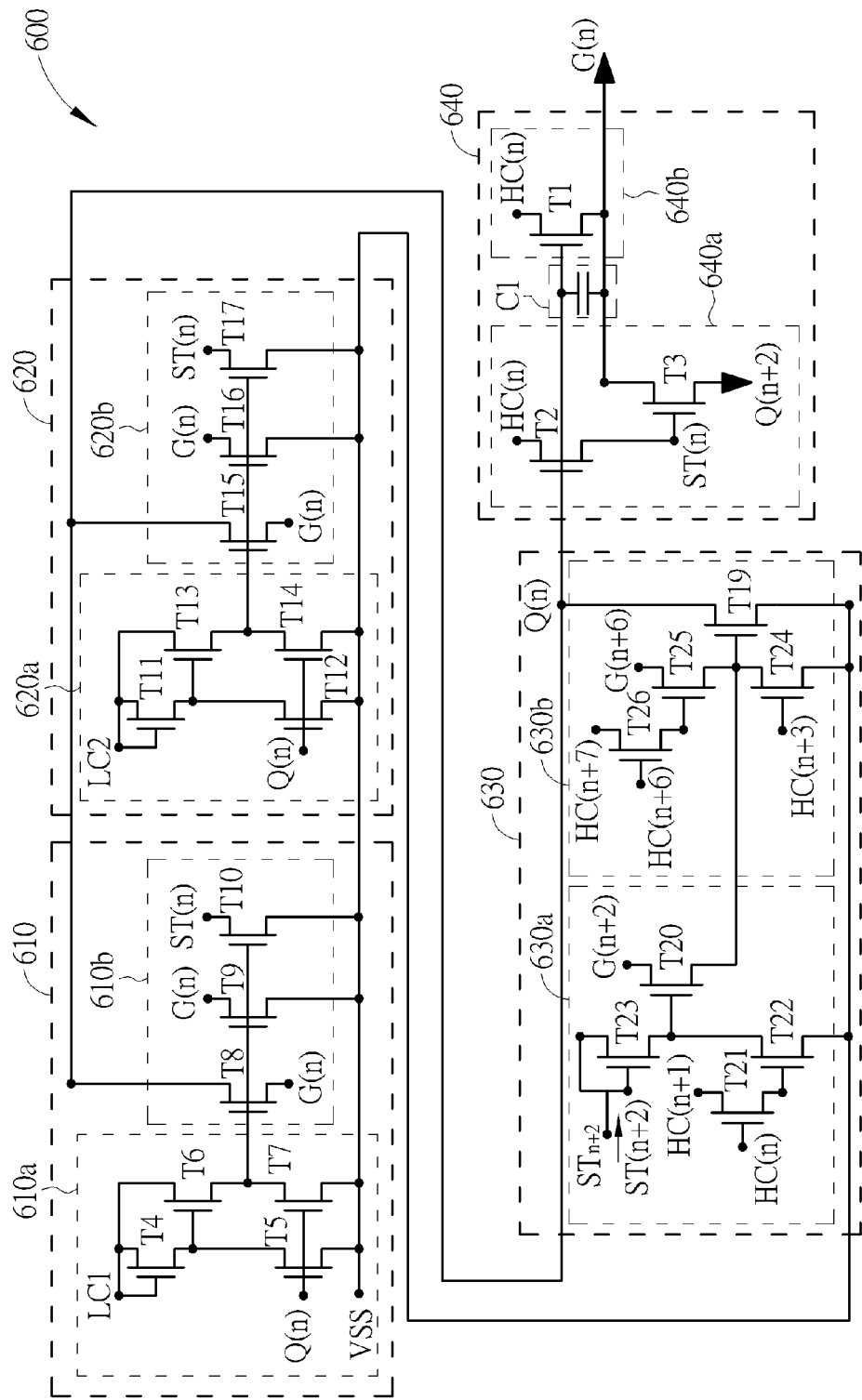
FIG. 6 illustrates a shift register of an odd-numbered stage according to an embodiment of the present invention.

FIG. 6 illustrates a shift register 600 of an odd-numbered stage according to an embodiment of the present invention. Comparing with what is illustrated by FIG. 3, it may be taken as an example to substitute 2 for the parameter a and substitute 6 for the parameter b. The shift register 600 includes a first voltage stabilizing unit 610, a second voltage stabilizing unit 620, a main pull-down unit 630 and a main pull-up unit 640. The first voltage stabilizing unit 610 includes a first pull-down control unit 610a and a first pull-down unit 610b. The second voltage stabilizing unit 620 includes a second pull-down control unit 620a and a second pull-down unit 620b. The main pull-down unit 630 includes a first sub-pull-down unit 630a and a second sub-pull-down unit 630b. The main pull-up unit 640 includes a pull-up control unit 640a and a pull-up unit 640b. In the first voltage stabilizing unit 610, the first pull-down control unit 610a includes transistors T4, T5, T6 and T7, and the first pull-down unit 610b includes transistors T8, T9 and T10. A gate terminal and a first terminal of the transistor T4 are coupled to the first stabilizing control signal source LC1 and a first terminal of the transistor T6. Gate terminals of the transistors T5 and T7 are coupled to the driving control signal source Qn. Second terminals of the transistors T5, T7, T9 and T10 are coupled to the low voltage terminal VSS. Gate terminals of the transistors T8 and T10 are coupled to a second terminal of the transistor T6 and a first terminal of the transistor T7. A second terminal of the transistor T8 and a first terminal of the transistor T9 are coupled to the gate-terminal signal source Gn. A first terminal of the transistor T10 is coupled to the setting signal source STn. The coupling of transistors of the second pull-down control unit 620a and the second pull-down unit 620b of the second voltage stabilizing unit 620 is similar to the coupling of the transistors of the first voltage stabilizing unit 610, so it is not described repeatedly. However, first terminals of the transistors T11 and T13 are coupled to the second stabilizing control signal source LC2, and the signals provided by the first stabilizing control signal source LC1 and by the second stabilizing control signal source LC2 are in opposite phase so as to perform voltage stabilization operation by turns. When the first stabilizing control signal LC(1) is high, the transistors T4 and T6 are turned on. If the driving control signal Q(n) is high, the transistors T5 and T7 may be turned on for gate terminal levels of the transistors T8 and T10 are pulled down to the low voltage terminal VSS so that the transistors T8 and T10 are turned off and may not perform the voltage stabilizing function. During the duration t1 shown in FIG. 2, since the driving control signal Q(n) is of a high floating state, the first and second voltage stabilizing units 610 and 620 are turned off and stop perform voltage stabilizing function. It may be taken as an example to substitute 1 for the parameter n to set the driving control signal Q(n) as the first the driving control signal Q(1) when referring to FIG. 2.

As illustrated in FIG. 6, the first sub-pull-down unit 630a includes transistors T20, T21, T22 and T23, and the second sub-pull-down unit 630b includes transistors T19, T24, T25 and T26. The transistor T21 includes a gate terminal configured to receive a pulse signal HC(n), a first terminal configured to receive a pulse signal HC(n+1) and a second terminal. The second transistor T22 includes a first terminal, a gate terminal coupled to the second terminal of the transistor T21, and a second terminal coupled to the low voltage terminal VSS. The transistor T23 includes a first terminal coupled to a setting control signal source $ST_{n+2}$, a gate terminal coupled to the first terminal of the transistor T23, and a second terminal coupled to the first terminal of the transistor T22. The transistor T20 includes a first terminal coupled to the gate-terminal signal source $G_{n+2}$, a gate terminal coupled to the second terminal of the transistor T23, and a second terminal. The transistor T24 includes a first terminal coupled to the second terminal of the transistor T20, a gate terminal configured to receive a pulse signal H(n+3), and a second terminal coupled to the low voltage terminal VSS. The gate terminal of the transistor T24 may also receive the pulse signal HC(n) of the present stage or the pulse signal HC(n+1) of the next stage. The transistor T25 includes a first terminal coupled to a gate-terminal signal source $G_{n+6}$, a second terminal coupled to the first terminal of the transistor T24, and a gate terminal. The transistor T26 includes a gate terminal configured to receive a pulse signal HC(n+6), a first terminal configured to receive a pulse signal HC(n+7), and a second terminal coupled to a gate terminal of the transistor T25. The transistor T19 includes a first terminal coupled to the driving control signal source Qn, a second terminal coupled to the low voltage terminal VSS, and a gate terminal coupled to the second terminal of the transistor T20 and the second terminal of the transistor T25. When in the second display mode, the pulse signals HC(n) and HC(n+1) are in phase, and the pulse signals HC(n+6) and HC(n+7) are in phase, wherein the parameter n is an odd integer larger than zero.

Figure 7:
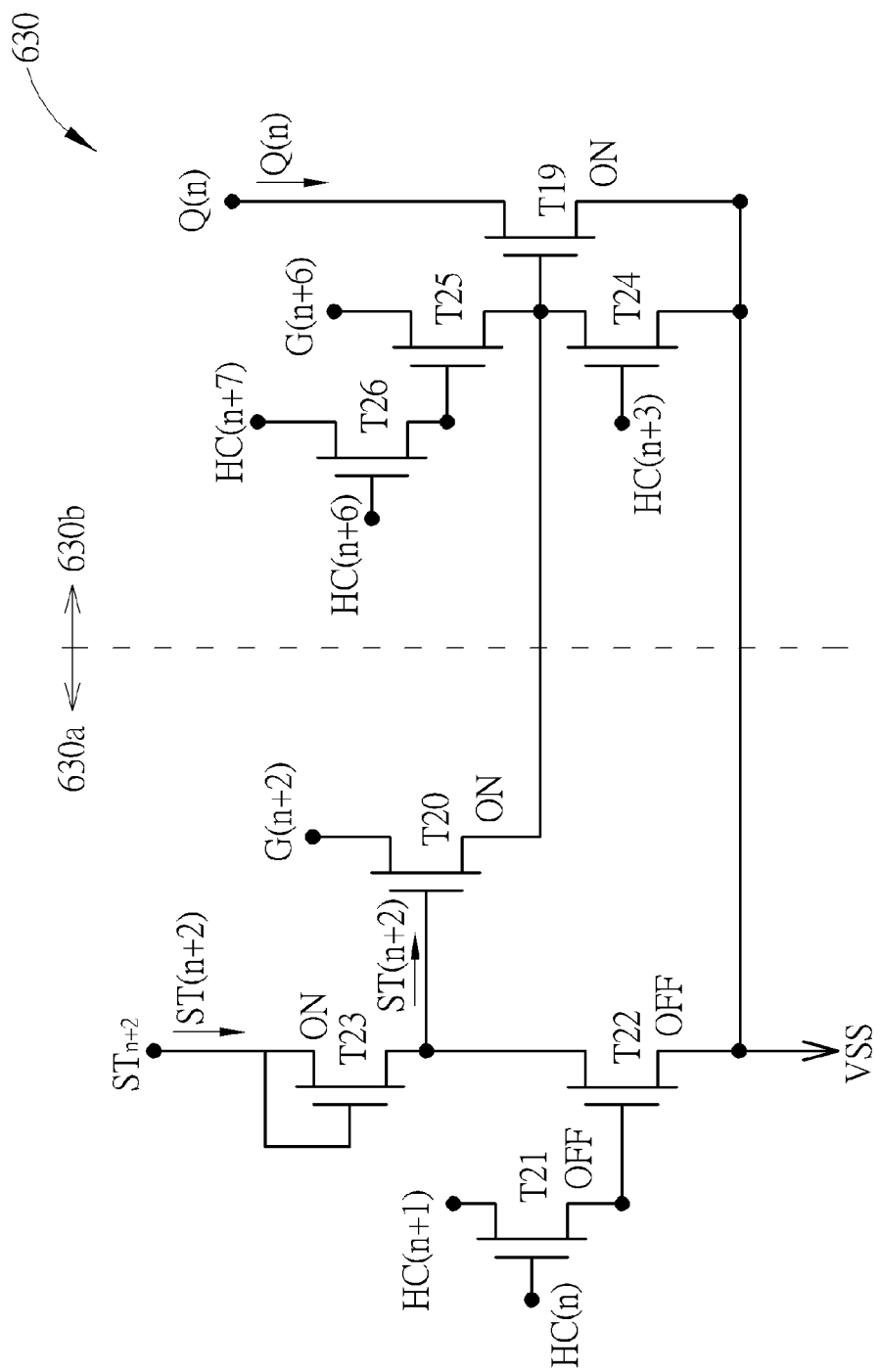
FIG. 7 illustrates the operation of the main pull-down unit shown in FIG. 6 in the first display mode.
Figure 8:
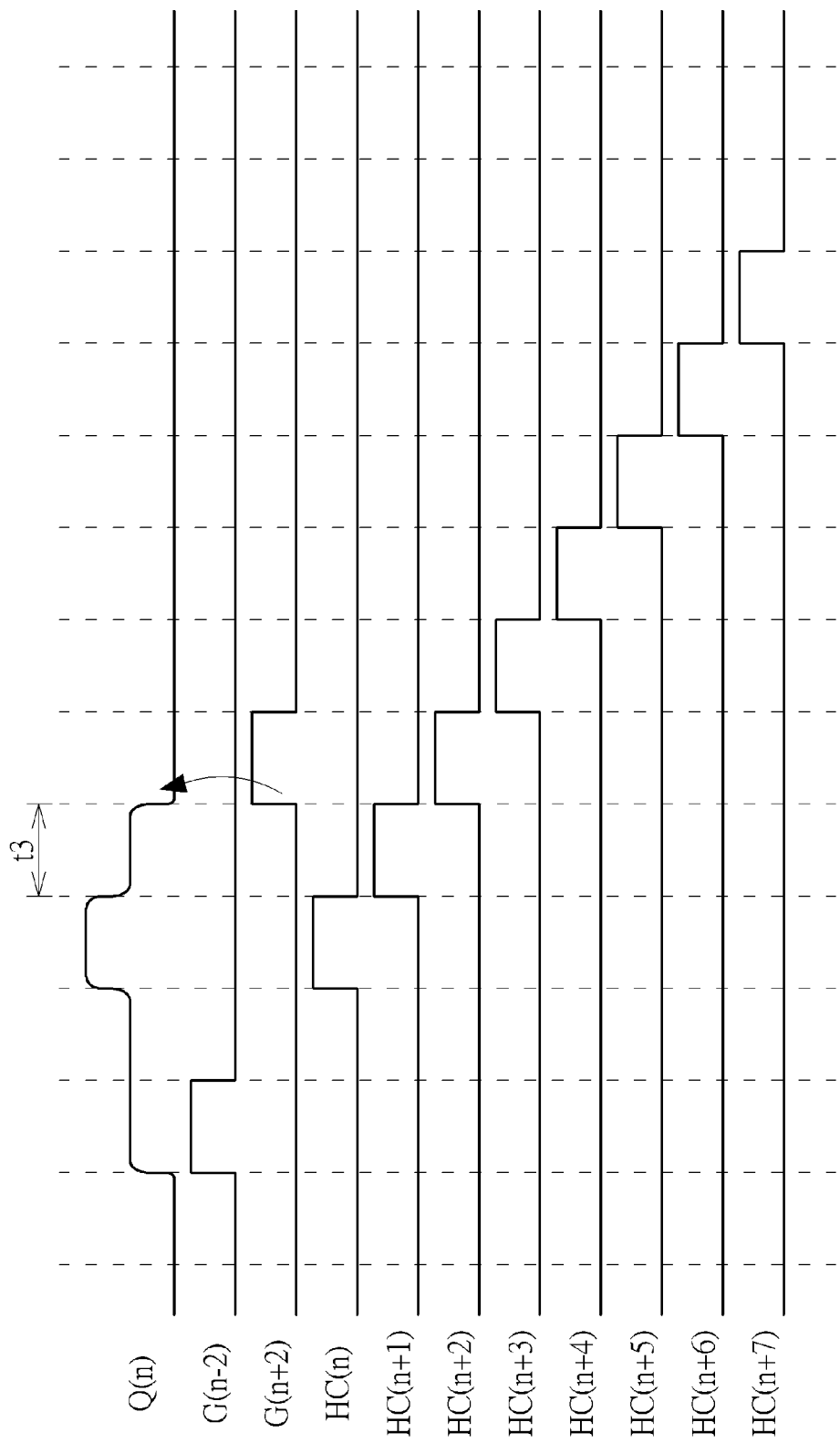
FIG. 8 illustrates a waveform diagram corresponding to the operation in the first display mode of the main pull-down unit shown in FIG. 7.

FIG. 7 illustrates the operation of the main pull-down unit 630 shown in FIG. 6 in the first display mode. FIG. 8 illustrates a waveform diagram corresponding to the operation in the first display mode of the main pull-down unit 630 shown in FIG. 7. According to FIG. 8, since the time difference from the pulse signal HC(n) to the pulse signal HC(n+1) is one pulse-width, the pulse signals HC(n) and HC(n+1) are in opposite phases, the transistor T21 is turned off, and the transistor T22 is also turned off. The setting signal source $ST_{n+2}$ is in dual connection with the first terminal and the gate terminal of the transistor T23 and provides the setting signal ST(n+2) so that the setting signal ST(n+2) is transmitted to the gate terminal of the transistor T20 via the transistor T23. Since the transistor T22 is turned off, the transistor T20 may be controlled and turned on by the setting signal ST(n+2). The gate-terminal signal G(n+2) may be transmitted to the gate terminal of the transistor T19 via the transistor T20 so as to turn on the transistor T19. The driving control signal source Qn may also be coupled to the low voltage terminal VSS via the transistor T19, so the driving control signal Q(n) may be controlled by the gate-terminal signal G(n+2) and pulled down to the low voltage terminal VSS. In FIG. 7, the gate terminal of the transistor T24 may also be configured to receive the pulse signal HC(n) of the present stage or the pulse signal HC(n+1) of the next stage.

According to an embodiment illustrated by FIG. 8, the gate-terminal signal G(n) is in phase with the pulse signal HC(n), the gate-terminal signal G(n+1) is in phase with the pulse signal HC(n+1), and so on. According to the operation illustrated in FIGS. 7 and 8, the transistor T19 may be turned on at the rising edge of the gate-terminal signal G(n+2), and the driving control signal Q(n) may be pulled down to the low voltage terminal VSS. Hence, the duration for the driving control signal Q(n) to be of the high floating state may be the duration t3 that is merely one pulse-width rather than a five pulse-width duration such as the duration t1 shown in FIG. 2. The weakness of the prior art related to that the gate-terminal signals are easily interfered by noise can be significantly improved. According to the operation shown in FIGS. 7 and 8, the driving control signal Q(n) is controlled and pulled down by the gate-terminal signal G(n+2), and the operation may be referred to as the three-pull-down-one operation.

Figure 9:
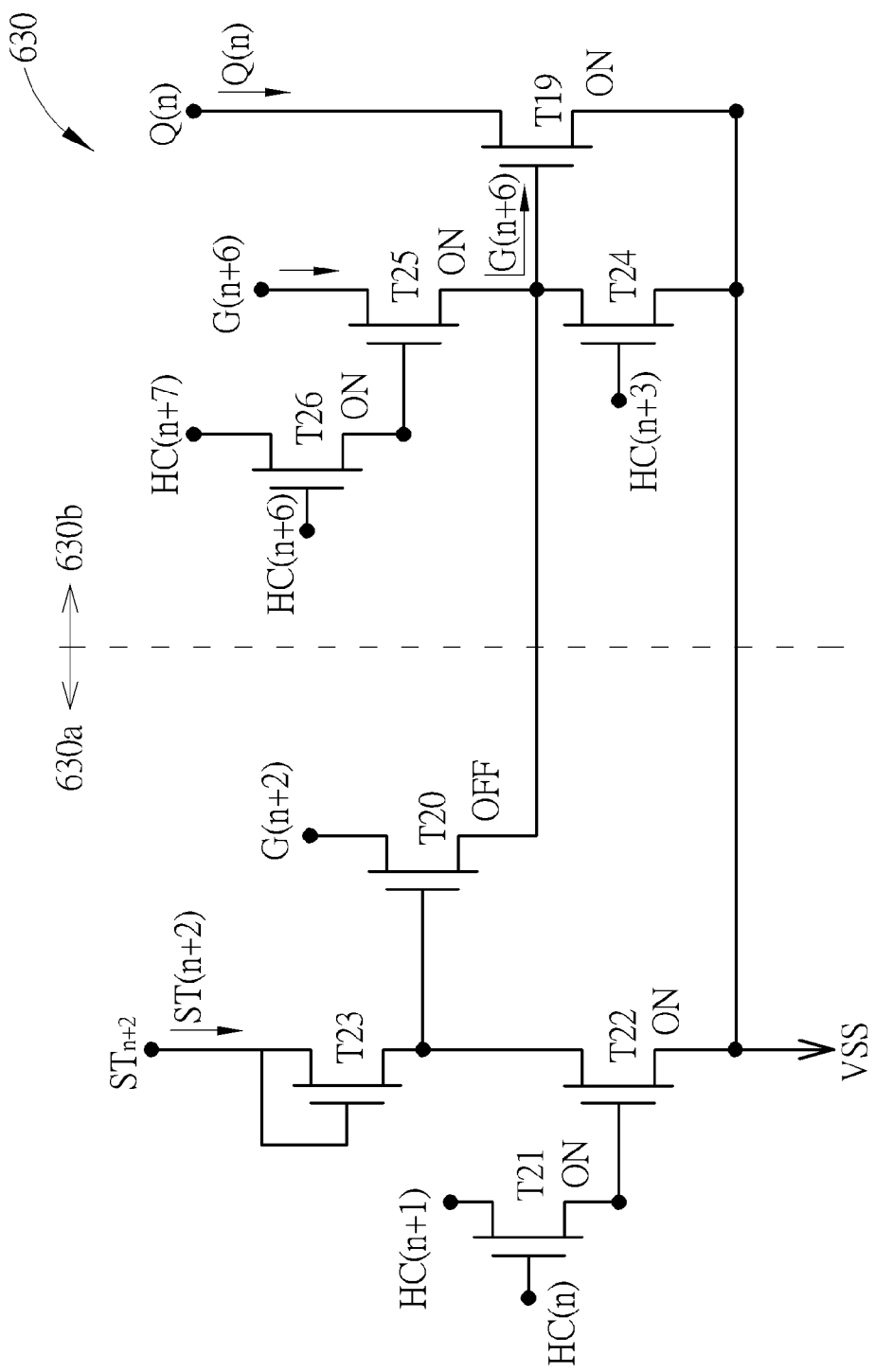
FIG. 9 illustrates the operation of the main pull-down unit 630 of FIG. 6 in the second display mode.
Figure 10:
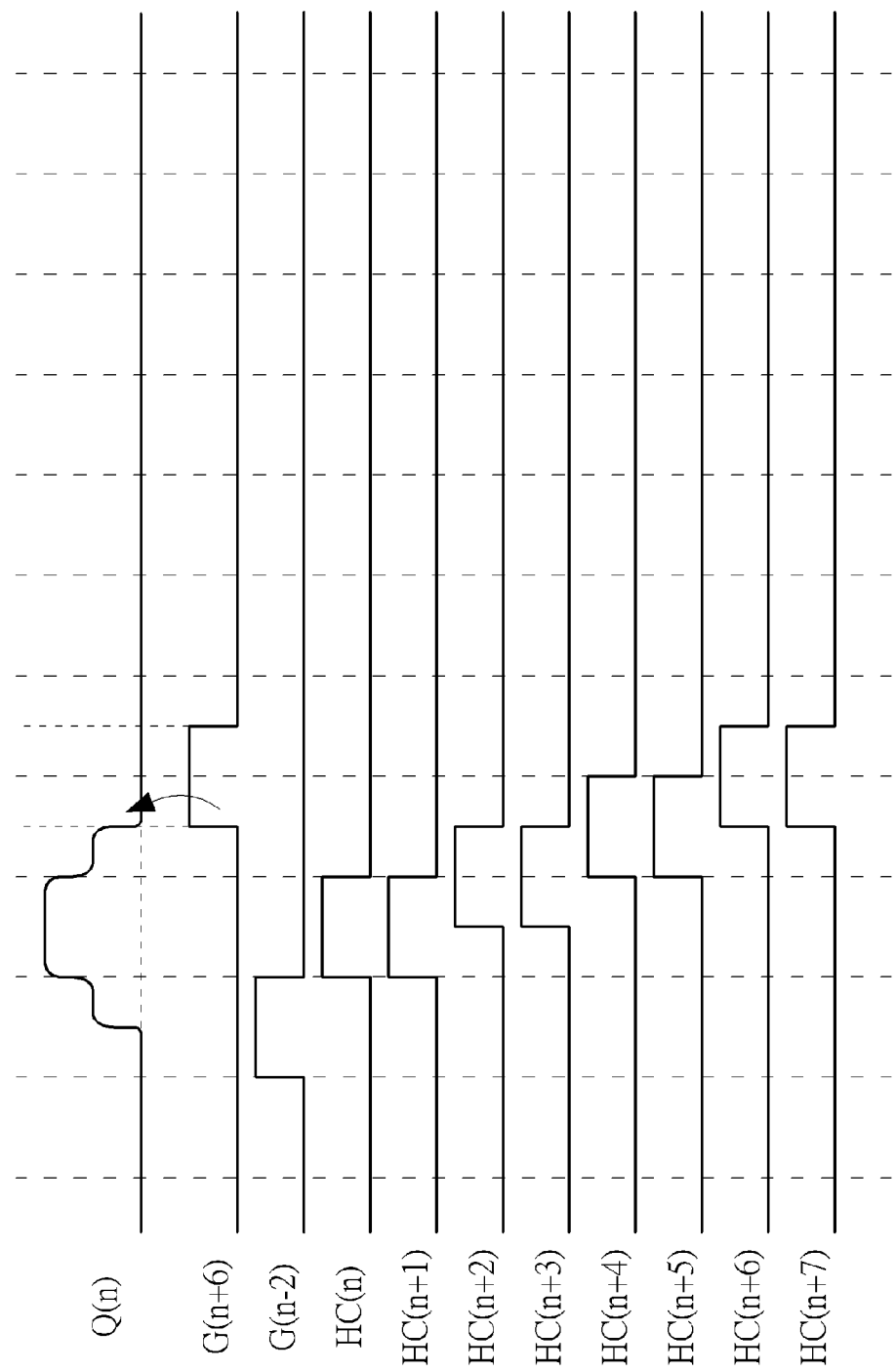
FIG. 10 illustrates a waveform diagram corresponding to the operation in the second display mode of the main pull-down unit shown in FIG. 9.

FIG. 9 illustrates the operation of the main pull-down unit 630 of FIG. 6 in the second display mode. FIG. 10 illustrates a waveform diagram corresponding to the operation in the second display mode of the main pull-down unit 630 shown in FIG. 9. According to FIG. 10, in the second display mode, when the parameter n is an odd and positive integer, the pulse signals HC(n) and HC(n+1) are in phase, the pulse signals HC(n+2) and HC(n+3) are in phase, the pulse signals HC(n+6) and HC(n+7) are in phase, and the difference between the pulse signals HC(n) and HC(n+2) is 0.5 pulse-width. As shown in FIG. 9, when the pulse signals HC(n) and HC(n+1) are high, the transistor T22 is turned on, the level of the gate terminal of the transistor T20 is pulled down to the low voltage terminal VSS so that the transistor T20 is turned off, and the gate-terminal signal G(n+2) is not transmitted to the gate terminal of the transistor T19 via the transistor T20. When the pulse signals HC(n+6) and HC(n+7) are both high, the transistor T26 is turned on, so the gate-terminal signal G(n+6) is transmitted to the gate terminal of the transistor T19 via the transistor T25 to turn on the transistor T19, and the driving control signal Q(n) is pulled down to the low voltage terminal VSS via the transistor T19. According to the operation shown in FIGS. 9 and 10, the driving control signal Q(n) is controlled and pulled down by the gate-terminal signal G(n+6), and the operation may be referred to as the seven-pull-down-one operation. In FIG. 9, the gate terminal of the transistor T24 may also receive the pulse signal HC(n) of the present stage or the pulse signal HC(n+1) of the next stage.

According to the embodiments shown in FIGS. 6-10, when the parameter n is a positive odd integer, the main pull-down unit 630 may perform the seven-pull-down-one operation when being in a three-dimensional display mode and perform the three-pull-down-one operation when being in a two-dimensional display mode to shorten the duration in which the driving control signal Q(n) is of the high floating state to avoid interfering the display of pixels.

Figure 11:
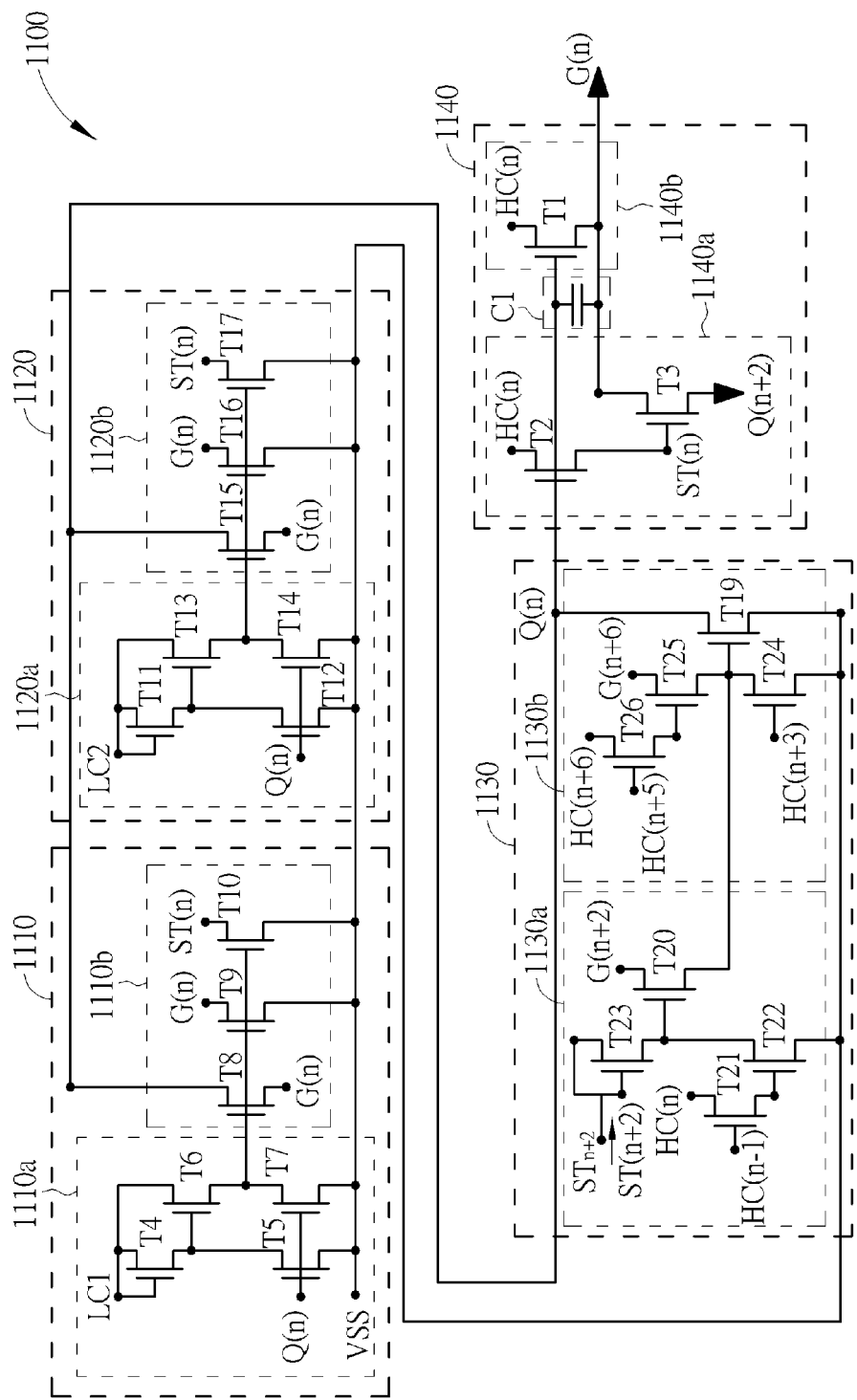
FIG. 11 illustrates a shift register of an even-numbered stage according to an embodiment of the present invention.
Figure 12:
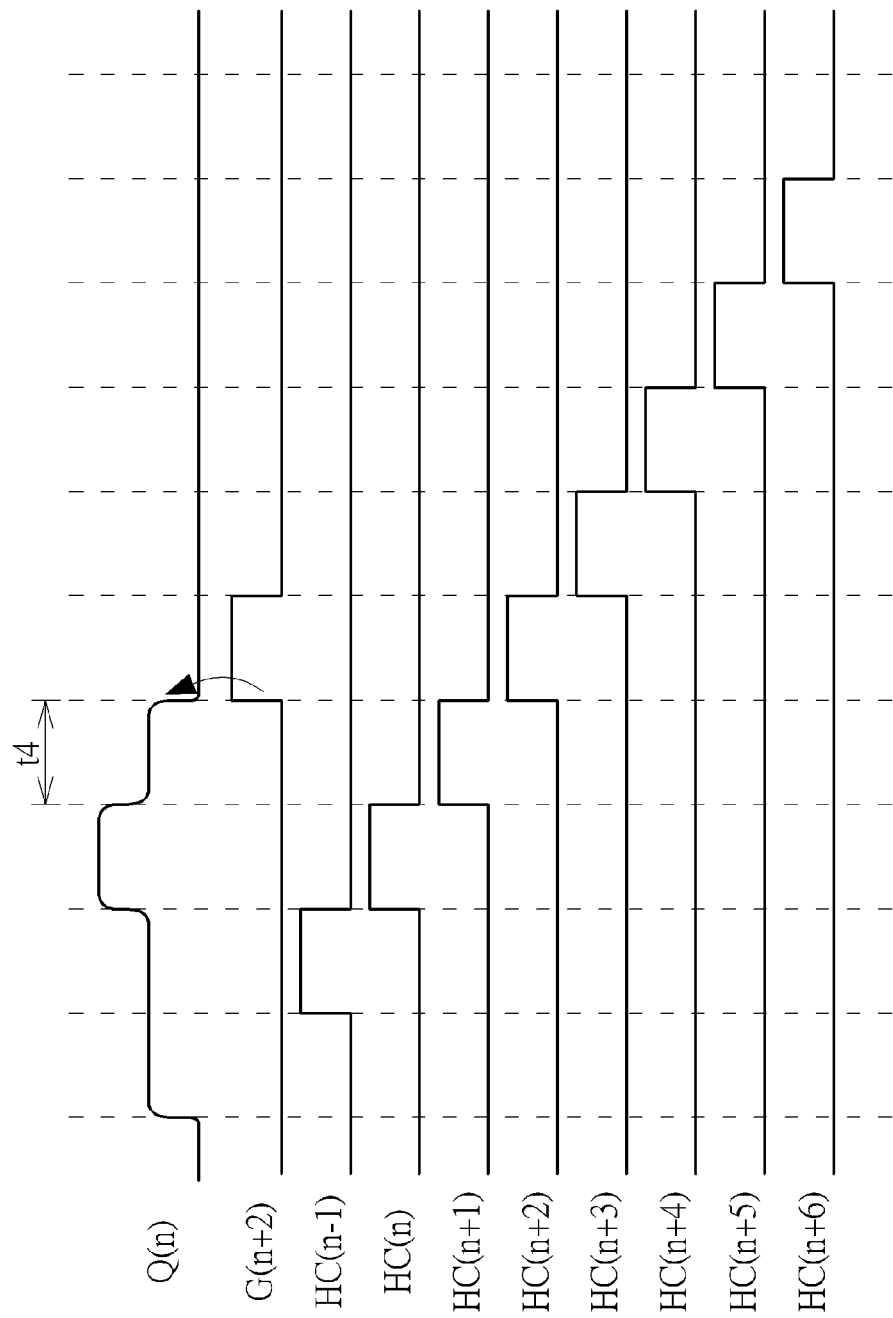
FIG. 12 illustrates a waveform diagram corresponding to the operation in the first display mode of the main pull-down unit shown in FIG. 11.
Figure 13:
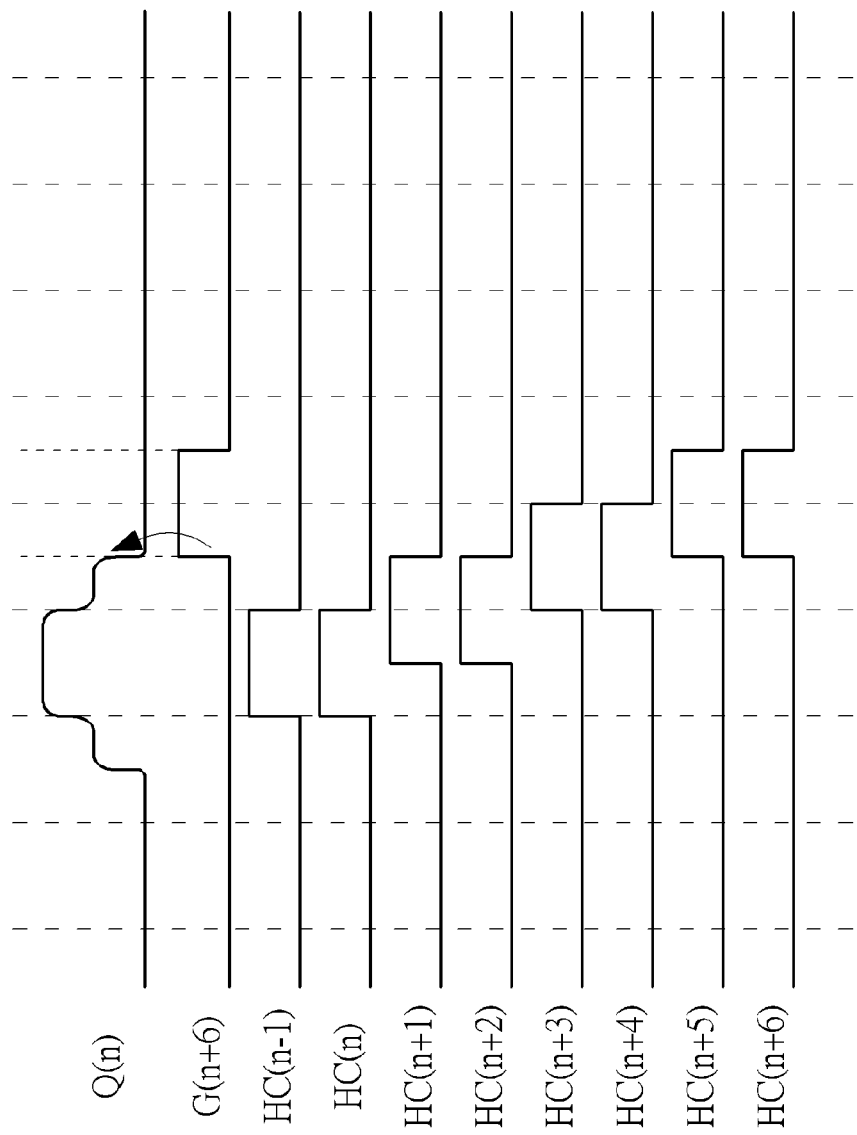
FIG. 13 illustrates a waveform diagram corresponding to the operation in the second display mode of the main pull-down unit shown in FIG. 11.

FIG. 11 illustrates a shift register 1100 of an even-numbered stage according to an embodiment of the present invention. The coupling of transistors of a first voltage stabilizing unit 1110 (including a first pull-down control unit 1110a and a first pull-down unit 1110b), a second voltage stabilizing unit 1120 (including a second pull-down control unit 1120a and a second pull-down unit 1120b), a main pull-down unit 1130 (including a first sub-pull-down unit 1130a and a second sub-pull-down unit 1130b) and a main pull-up unit 1140 (including a pull-up control unit 1140a and a pull-up unit 1140b) is similar to the shift register 600 shown in FIG. 6, so it is not described repeatedly. However, for the shift register 1100 to operate normally when the parameter n is a positive even integer, the signals inputted into the main pull-down unit 1130 have to be adjusted as described below. As shown in FIG. 11, in the first sub-pull-down unit 1130a, the transistor T21 includes a gate terminal configured to receive a pulse signal HC(n−1) and a first terminal configured to receive the pulse signal HC(n). The transistor T26 of the second sub-pull-down unit 1130b includes a gate terminal configured to receive a pulse signal HC(n+5) and a first terminal configured to receive a pulse signal HC(n+6). The said parameter n is a positive even integer. When being in the second display mode, the pulse signals HC(n−1) and HC(n) are in phase, and the pulse signals HC(n+5) and HC(n+6) are in phase. FIG. 12 illustrates a waveform diagram corresponding to the operation in the first display mode of the main pull-down unit 1130 shown in FIG. 11. FIG. 13 illustrates a waveform diagram corresponding to the operation in the second display mode of the main pull-down unit 1130 shown in FIG. 11. In FIG. 12, the operation is similar to description above. When being in the first display mode, since the pulse signals HC(n−1) and HC(n) are not in phase, the transistor T21 is turned off, and the gate-terminal signal G(n+2) is transmitted to the gate terminal of the transistor T19 via the transistor T20 so that the driving control signal source Qn is coupled to the low voltage terminal VSS via the transistor T19, and the three-pull-down-one operation in which the gate-terminal signal G(n+2) is used for controlling and pulling down the driving control signal Q(n) is performed. Regarding FIG. 13, when being in the first display mode, since the pulse signals HC(n−1) and HC(n) are in phase, the transistor T21 is turned on so that the transistor T22 is also turned on, the gate terminal of the transistor T20 is coupled to the low voltage terminal VSS via the transistor T22 so that the transistor T20 is turned off, and the gate-terminal signal G(n+2) does not affect the driving control signal source Qn coupling to the first terminal of the transistor T19 via the transistor T20. However, since the pulse signals HC(n+5) and HC(n+6) are in phase, when the pulse signals HC(n+5) and HC(n+6) are both high, the transistor T26 is turned on and controls the gate terminal of the transistor T25 to turn on the transistor T25, and the gate-terminal signal G(n+6) is transmitted to the gate terminal of the transistor T19 via the transistor T25 to turn on the transistor T19. Hence, the high state pulse of the gate-terminal signal G(n+6) may pull the driving control signal Q(n) down to the low voltage terminal VSS, and the seven-pull-down-one operation in the second display mode is performed. In FIG. 11, the gate terminal of the transistor T24 may also receive the pulse signal HC(n) of the present stage or the pulse signal HC(n+1) of the next stage.

Figure 14:
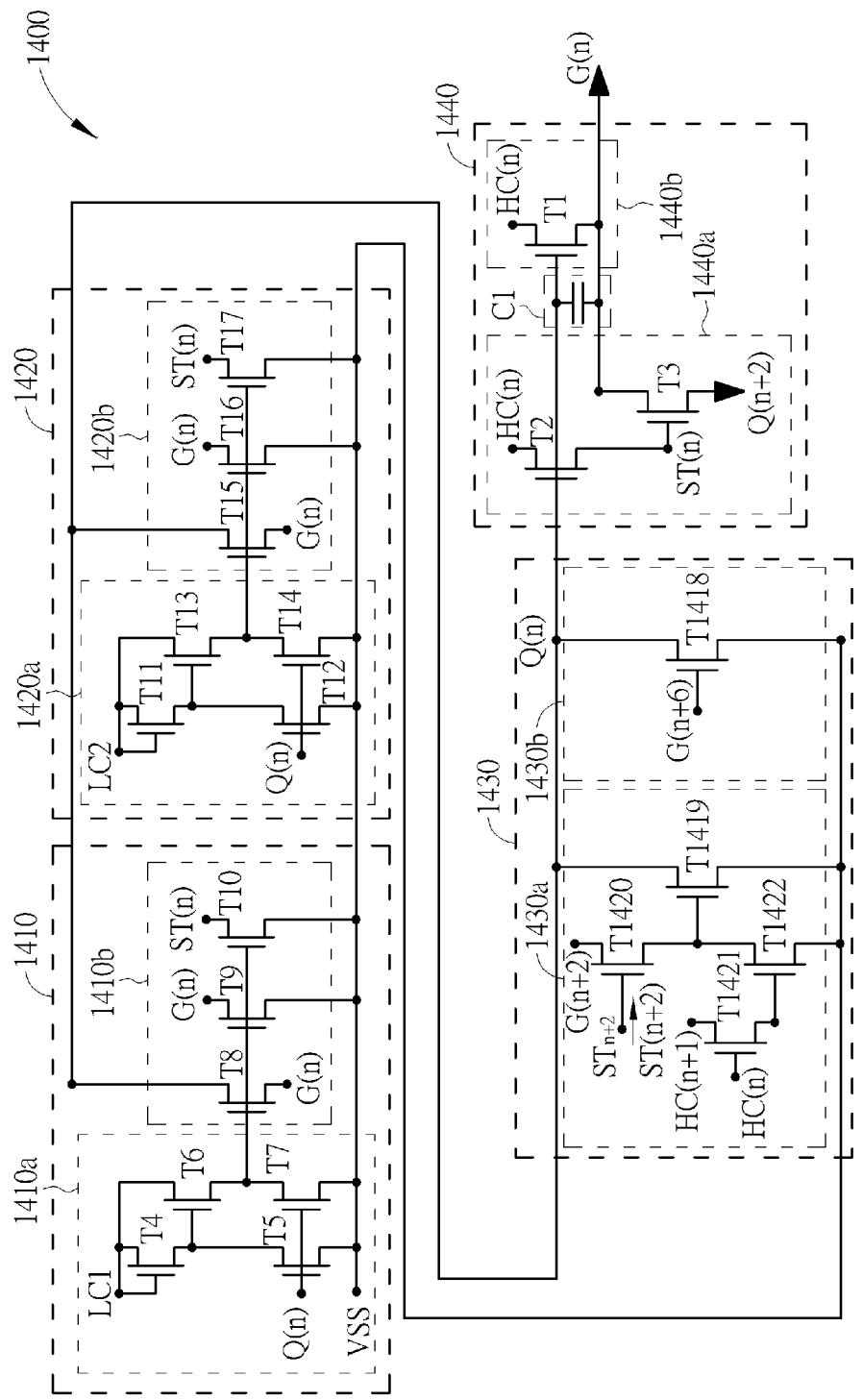
FIG. 14 illustrates a shift register of an odd-numbered stage according to an embodiment of the present invention.

FIG. 14 illustrates a shift register 1400 of an odd-numbered stage according to an embodiment of the present invention. The coupling of transistors of a first voltage stabilizing unit 1410 (including a first pull-down control unit 1410a and a first pull-down unit 1410b), a second voltage stabilizing unit 1420 (including a second pull-down control unit 1420a and a second pull-down unit 1420b), and a main pull-up unit 1440 (including a pull-up control unit 1440a and a pull-up unit 1440b) is similar to the shift register 600 shown in FIG. 6, so it is not described repeatedly. In a main pull-down unit 1430, a first sub-pull-down unit 1430a includes transistors T1419, T1420, T1421 and T1422. The transistor T1421 includes a gate terminal configured to receive the pulse signal HC(n), a first terminal configured to receive the pulse signal HC(n+2) and a second terminal. The transistor T1422 includes a gate terminal coupled to the second terminal of the transistor T1421, a first terminal, and a second terminal coupled to the low voltage terminal VSS. The transistor T1420 includes a gate terminal coupled to the setting signal source $ST_{n+2}$, a first terminal coupled to the gate-terminal signal source $G_{n+2}$, and a second terminal coupled to the first terminal of the transistor T1422. The transistor T1419 includes a gate terminal coupled to the first terminal of the transistor T1422, a first terminal coupled to the driving control signal source Qn, and a second terminal coupled to the low voltage terminal VSS. The second sub-pull-down unit 1430b includes a transistor T1418. The transistor T1418 includes a gate terminal coupled to the gate-terminal signal source $G_{n+6}$ for receiving the gate-terminal signal G(n+6), a first terminal coupled to the driving control signal source Qn, and a second terminal coupled to the low voltage terminal VSS. In the second display mode, the pulse signals HC(n) and HC(n+1) are in phase. The said parameter n may be an odd integer larger than zero.

Figure 15:
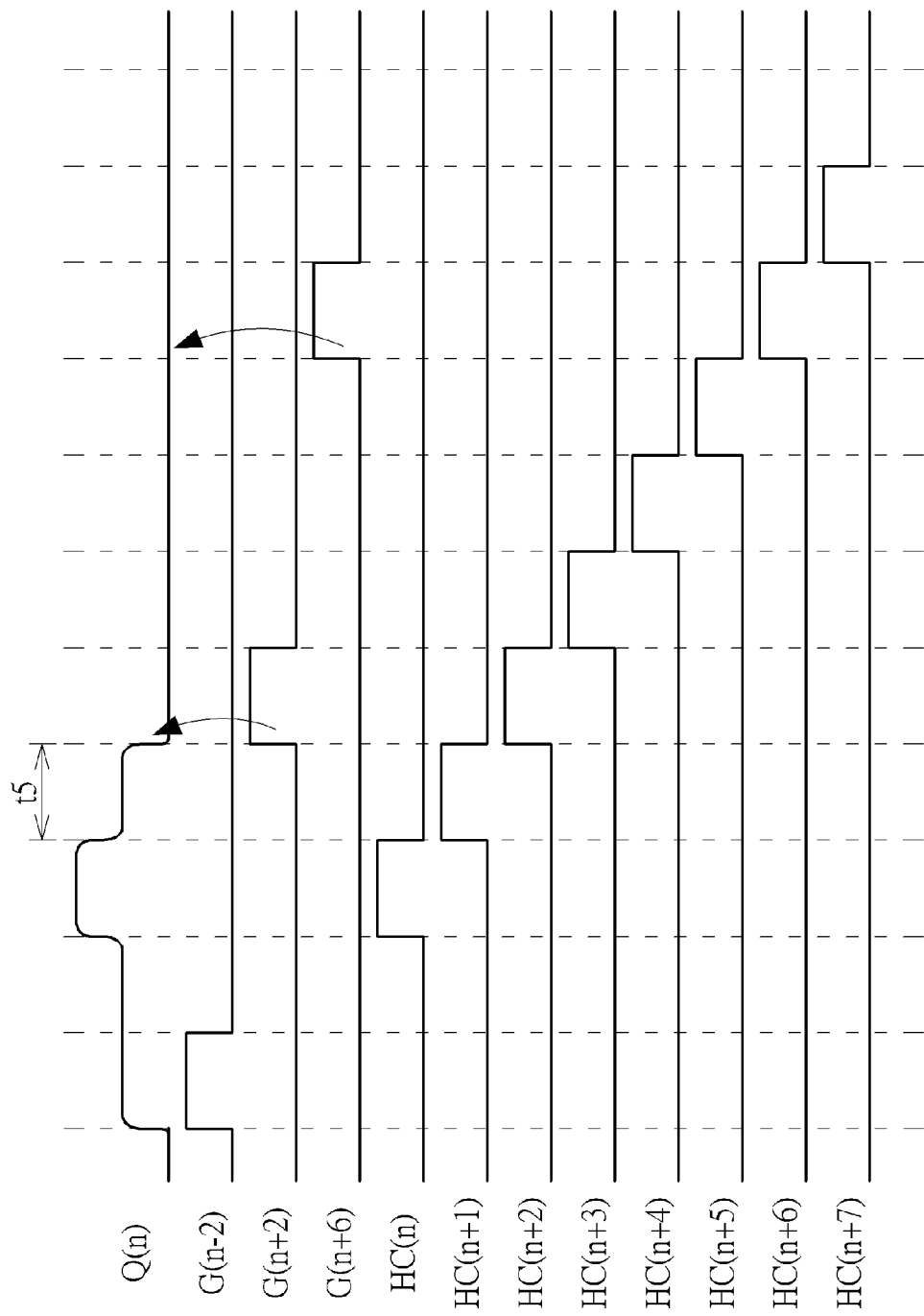
FIG. 15 illustrates a waveform diagram corresponding to the operation in the first display mode of the shift register shown in FIG. 14.

FIG. 15 illustrates a waveform diagram corresponding to the operation in the first display mode of the shift register 1400 shown in FIG. 14. According to FIG. 15, each of the pulse signals HC(n) to HC(n+7) is with a one pulse-width difference from the previous pulse signal. The driving control signal Q(n) (being of the nth stage) rises because parasite capacitors are charged when the gate-terminal signal G(n−2) rises to be high, and the driving control signal Q(n) is further pushed up because a capacitor C1 is charged when the gate-terminal signal G(n) is high. When the gate-terminal signal G(n+2) is high, since the pulse signals HC(n) and HC(n+1) are of opposite states, the transistors T1421 and T1422 are turned off, and the setting signal ST(n+2) may be set to be high to make the gate terminal of the transistor T1420 receive a high state signal to turn on the transistor T1420. The gate-terminal signal G(n+2) may be transmitted to the gate terminal of the transistor T1419 to turn on the transistor T1419, and the driving control signal Q(n) may be controlled by the gate-terminal signal G(n+2) and be pulled down to the low voltage terminal VSS. That is to say, the three-pull-down-one operation is well performed. According to FIGS. 14 and 15, when the pulse signal HC(n+6) is high, the corresponding gate-terminal signal G(n+6) is also high, the gate terminal of the transistor T1418 is of a high state so that the transistor T1418 is turned on and the driving control signal Q(n) is pulled down. However, since the driving control signal Q(n) has been pulled down to be low at that time, the driving control signal Q(n) is not affected. Hence, when the shift register 1400 operates in the first display mode, the duration for the driving control signal Q(n) to be of the high floating state is shortened to be one pulse-width such as the duration t5 shown in FIG. 15.

When being in the second display mode and the parameter n is a positive odd integer, the pulse signals HC(n) and HC(n+1) are in phase so that the transistor T1421 is turned on, the transistor T1422 is also turned on, and the level of the gate terminal of the transistor T1419 is pulled down to the low voltage terminal VSS so that the transistor T1419 is turned off. The gate-terminal signal G(n+2) fails to control the gate terminal of the transistor T1418 to turn on the transistor T1418, so the driving control signal Q(n) is pulled down to the low voltage terminal VSS when the gate-terminal signal G(n+6) is high, and the seven-pull-down-one operation is achieved. The corresponding waveform diagram is similar to what is shown in FIG. 10, so it is not described repeatedly.

Figure 16:
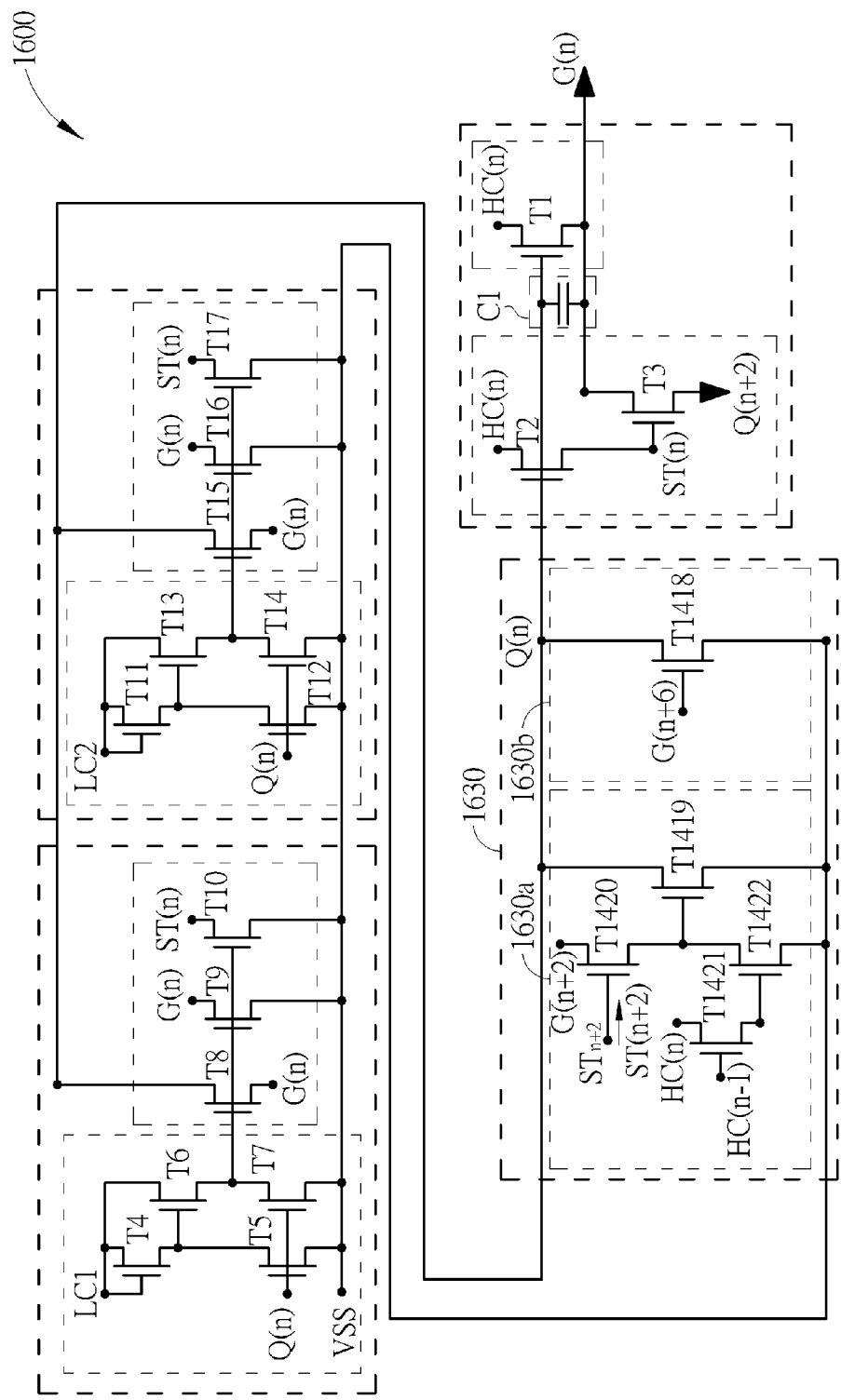
FIG. 16 illustrates a shift register of an even-numbered stage according to another embodiment of the present invention.

FIG. 16 illustrates a shift register 1600 of an even-numbered stage according to another embodiment of the present invention. The coupling of transistors of the shift register 1600 is similar to what is shown in FIG. 14, but the shift register 1400 of FIG. 14 is of an odd-numbered stage while the shift register 1600 is of an even-numbered stage, that is to say, the parameter n of the shift register 1600 is a positive even number. In the shift register 1600, the circuit structure and inputted signals are the same as what of the shift register 1400 except for the main pull-down unit 1630, so it is not described repeatedly. The difference from the main pull-down unit 1630 to the main pull-down unit 1430 of the shift register 1400 is that the gate terminal of the transistor T1421 is configured to receive the pulse signal HC(n−1), and the first terminal of the transistor T1421 is configured to receive the pulse signal HC(n). The operation waveform of the shift register 1600 in the second display mode may be as the waveforms shown in FIG. 13. Since the transistors T1421 and T1422 are turned on, the transistor T1419 is turned off, and the driving control signal Q(n) is pulled down to the low voltage terminal VSS via the transistor T1418 (being turned on) when the gate-terminal signal G(n+6) is high. The operation of seven-pull-down-one operation is performed.

Figure 17:
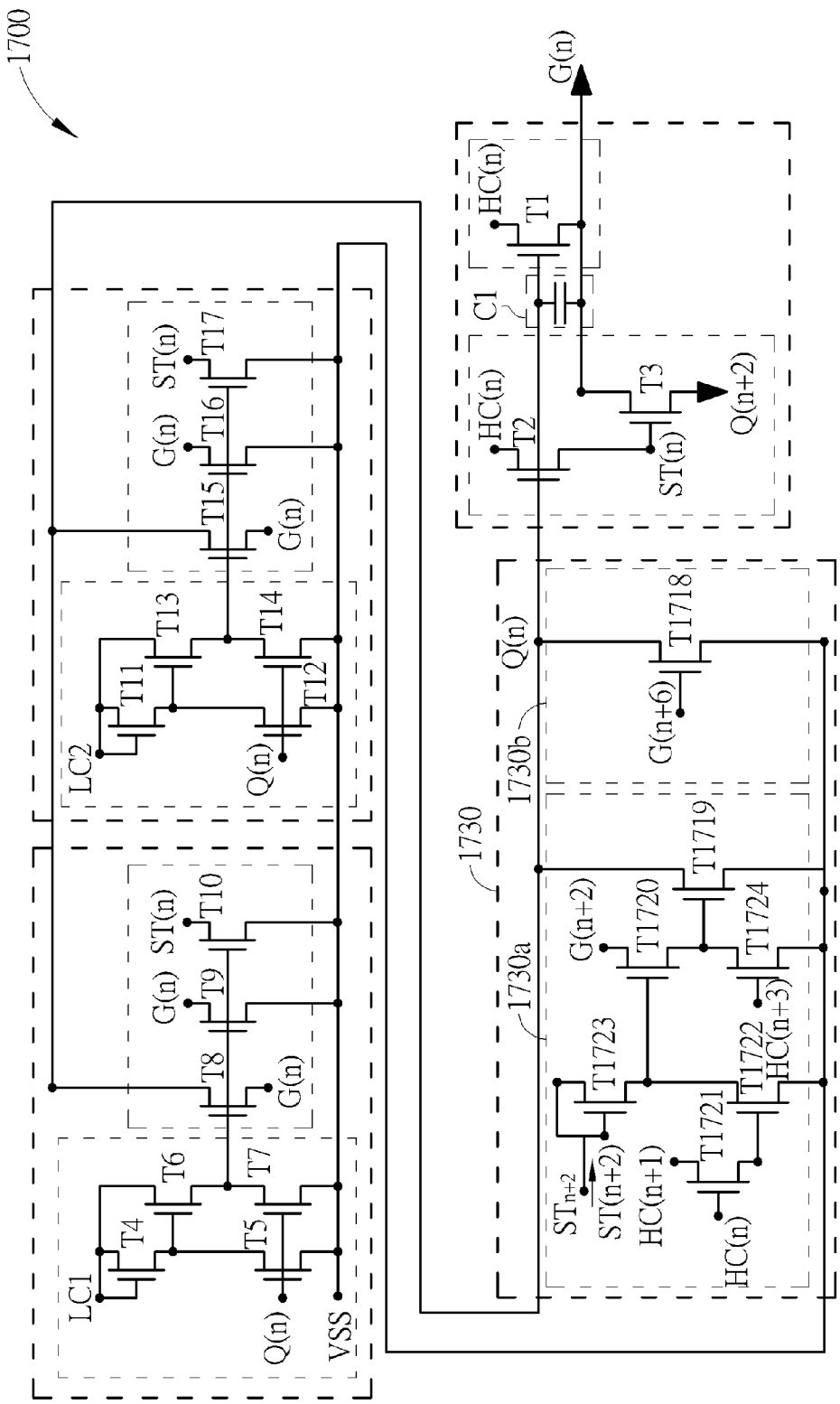
FIG. 17 illustrates a shift register of an odd-numbered stage according to another embodiment of the present invention.
Figure 18:
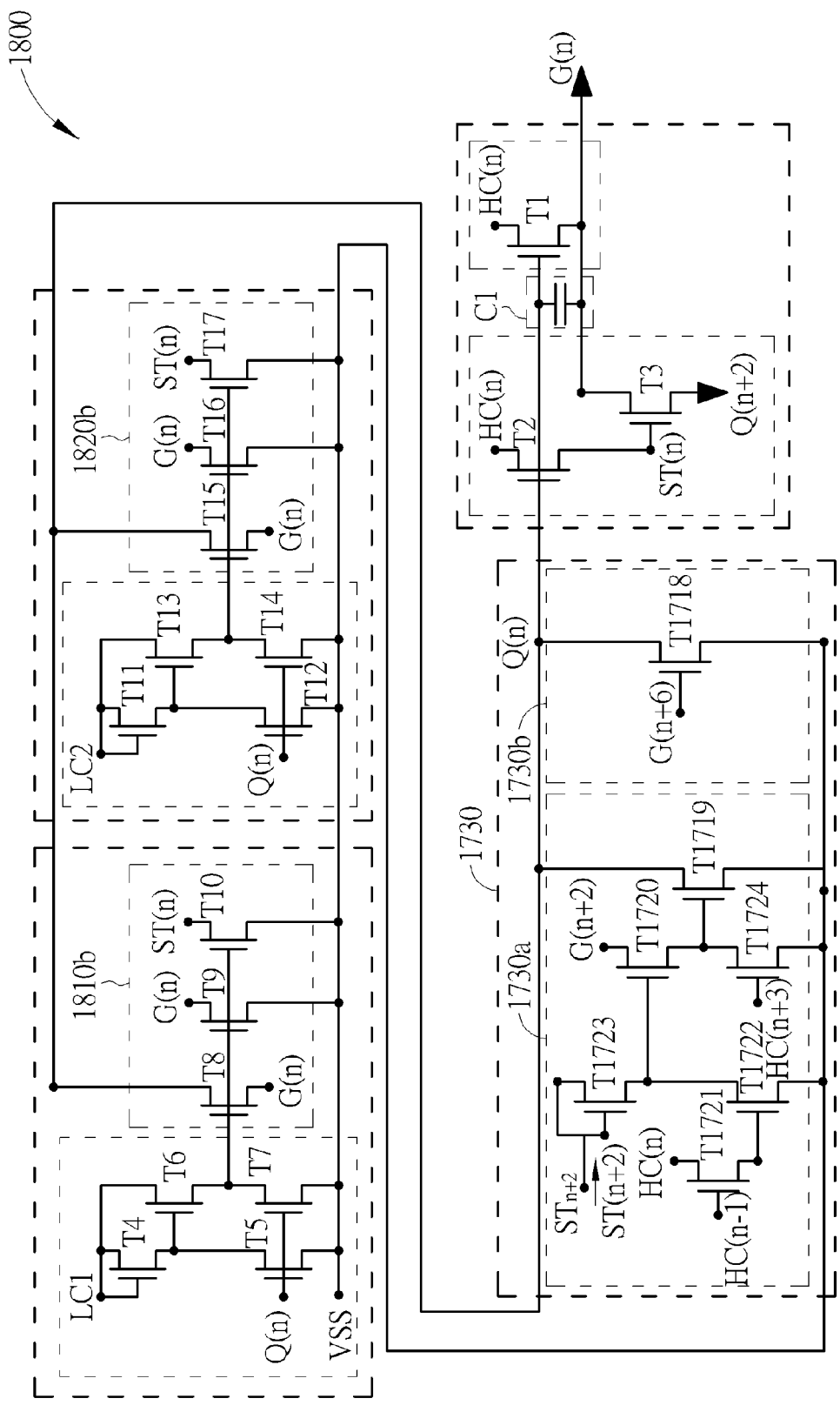
FIG. 18 illustrates a shift register of an even-numbered stage according to another embodiment of the present invention.

FIG. 17 illustrates a shift register 1700 of an odd-numbered stage according to another embodiment of the present invention. FIG. 18 illustrates a shift register 1800 of an even-numbered stage according to another embodiment of the present invention. The circuit structure of the shift register 1700 is the same as the first voltage stabilizing unit 610, the second voltage stabilizing unit 620 and the main pull-up unit 630 of the shift register 1600 except for the main pull-down unit 1730, so it is not described repeatedly. The main pull-down unit 1730 of the shift register 1700 includes a first sub-pull-down unit 1730a and a second sub-pull-down unit 1730b. The first sub-pull-down unit 1730a includes transistors T1719 to T1724, and the second sub-pull-down unit 1730b includes a transistor T1718. The transistor T1721 includes a gate terminal configured to receive the pulse signal HC(n), a first terminal configured to receive the pulse signal HC(n+1), and a second terminal. The transistor T1722 includes a gate terminal coupled to the second terminal of the transistor T1721, a first terminal, and a second terminal coupled to the low voltage terminal VSS. The transistor T1723 includes a gate terminal coupled to the setting signal source $ST_{n+2}$ for receiving the setting signal ST(n+2), a first terminal coupled to the gate terminal of the transistor T1723, and a second terminal coupled to the first terminal of the transistor T1722. The transistor T1724 includes a gate terminal coupled to the pulse signal source HC(n+3), a first terminal, and a second terminal coupled to the low voltage terminal VSS. The transistor T1720 includes a gate terminal coupled to the first terminal of the transistor T1722, a first terminal coupled to the gate-terminal signal source G(n+2), and a second terminal coupled to the first terminal of the transistor T1724. The transistor T1719 includes a gate terminal coupled to the first terminal of the transistor 1724, a first terminal coupled to the driving control signal source Qn, and a second terminal coupled to the low voltage terminal VSS. The transistor T1718 includes a gate terminal coupled to the gate-terminal signal source $G_{n+6}$ for receiving the gate-terminal signal G(n+6), a first terminal coupled to the driving control signal source Qn, and a second terminal coupled to the low voltage terminal VSS. When being in the second display mode, the pulse signals HC(n) and HC(n+1) are in phase.

The operation waveforms in the second display mode corresponding to the shift register 1700 of an odd-numbered stage shown in FIG. 17 may be like the waveforms shown in FIG. 10. When the pulse signals HC(n) and HC(n+1) are both high, the transistors T1721 and T1722 are turned on, the gate terminal of the transistor T1720 is coupled to the low voltage terminal VSS via the transistor T1722 so that the transistor T1720 is turned off. The gate-terminal signal G(n+2) fails to be transmitted to the gate terminal of the transistor T1719 via the transistor T1720 to turn on the transistor T1719 and pull down the driving control signal Q(n) to the low voltage terminal VSS. When the gate-terminal signal G(n+6) is high, the transistor T1718 is turned on, and the driving control signal Q(n) may be pulled down to the low voltage terminal VSS. In other words, in the second display mode, the driving control signal Q(n) is controlled and pulled down by the high state of the gate-terminal signal G(n+6) instead of the high state of the gate-terminal signal G(n+2), so the seven-pull-down-one operation is performed. In the first display mode, the operation waveforms corresponding to the shift register 1700 of an odd-numbered stage shown in FIG. 17 may be like the waveforms shown in FIG. 8. Since the pulse signals HC(n) and HC(n+1) are in different phases and with an one pulse-width difference, the transistors T1721 and T1722 are turned off. The transistor T1723 may be turned on so that the transistor T1720 may also be turned on. The transistor T1719 may be turned on so that the driving control signal Q(n) may be pulled down to the low voltage terminal VSS when the gate-terminal signal G(n+2) is high, and the three-pull-down-one operation is therefore performed. When the gate-terminal signal G(n+6) is high, the transistor T1718 is turned on to pull down the driving control signal Q(n) again. However, since the driving control signal Q(n) has been pulled down when the gate-terminal signal G(n+2) is high, the level of the driving control signal Q(n) is not affected by the pulling when the gate-terminal signal G(n+6) is high.

In FIG. 18, the circuit structure and the received signals of the shift register 1800 of an even-numbered stage is similar to the shift register 1700 of an odd-numbered stage, so it is not described repeatedly. However, comparing with FIG. 17, the configuration of the transistor T1721 is adjusted. It is seen that the transistor T1721 shown in FIG. 18 includes a gate terminal configured to receive the pulse signal HC(n−1) and a first terminal configured to receive the pulse signal HC(n), wherein the parameter n is a positive even integer. The shift register 1800 is allowed to perform the said three-pull-down-one operation in the first display mode by pulling down the driving control signal Q(n) when the gate-terminal signal G(n+2) is high, and perform the said seven-pull-down-one operation in the second display mode by pulling down the driving control signal Q(n) when the gate-terminal signal G(n+6) is high. The operation principle is similar to the operation principle of the shift register 1700 of an odd-numbered stage, so it is not described repeatedly.

The foresaid first sub-pull-down unit may be (but not limited to) a 2D pull-down unit. The foresaid second pull-down unit may be (but not limited to) a 3D pull-down unit. The foresaid first display mode may be (but not limited to) a 2D display mode for displaying 2D effect in a 2D display duration. The foresaid second display mode may be (but not limited to) a 3D display mode for displaying 3D effect in a 3D display duration. By using the shifter register disclosed by an embodiment of the present invention, the overlong duration of the high floating state of the driving control signal Q(n) may be shortened by the foresaid three-pull-down-one operation in the first display mode. For example, the overlong duration of the high floating state may be shortened from a five pulse-width duration to a one pulse-width duration. In the second display mode, the seven-pull-down-one operation may still performed normally, so the signal waveforms corresponding to the second display mode are not affected. In summary, the shift register disclosed by the present invention improves display quality and operation stability greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register comprising:
 a first voltage stabilizing unit comprising:
  a first pull-down control unit coupled to a low voltage terminal, a first stabilizing control signal source and a first driving control signal source; and
  a first pull-down unit coupled to the first pull-down control unit, the low voltage terminal, the first driving control signal source, a first gate-terminal signal source and a first setting signal source, and configured to pull a first gate-terminal signal, a first driving control signal and a first setting signal to the low voltage terminal when a first stabilizing control signal is of a high state;
 a second voltage stabilizing unit comprising:
  a second pull-down control unit coupled to the low voltage terminal, a second stabilizing control signal source and the first driving control signal source; and
  a second pull-down unit coupled to the second pull-down control unit, the low voltage terminal, the first driving control signal source, the first gate-terminal signal source and the first setting signal source, and configured to pull the first gate-terminal signal, the first driving control signal and the first setting signal to the low voltage terminal when a second stabilizing control signal is high, wherein the second stabilizing control signal and the first stabilizing control signal are in opposite phase;
 a main pull-down unit comprising:
  a first sub-pull-down unit coupled to a second gate-terminal signal source, the first driving control signal source and the low voltage terminal, configured to be controlled by a second gate-terminal signal for pulling down the first driving control signal to the low voltage terminal in a first display mode, and comprising:
   a first transistor comprising a gate terminal configured to receive a first pulse signal, a first terminal configured to receive a second pulse signal, and a second terminal;
   a second transistor comprising a first terminal, a gate terminal coupled to the second terminal of the first transistor, and a second terminal coupled to the low voltage terminal;
   a third transistor comprising a first terminal coupled to a second setting control signal source, a gate terminal coupled to the first terminal of the third transistor, and a second terminal coupled to the first terminal of the second transistor; and
   a fourth transistor comprising a first terminal coupled to the second gate-terminal signal source, a gate terminal coupled to the second terminal of the second transistor, and a second terminal; and
  a second sub-pull-down unit coupled to a third gate-terminal signal source, the first driving control signal source and the low voltage terminal, configured to be controlled by a third gate-terminal signal for pulling down the first driving control signal to the low voltage terminal in a second display mode, and comprising:
   a fifth transistor comprising a first terminal coupled to the second terminal of the fourth transistor, a gate terminal configured to receive a third pulse signal, and a second terminal coupled to the low voltage terminal;
   a sixth transistor comprising a first terminal coupled to the third gate-terminal signal source, a second terminal coupled to the first terminal of the fifth transistor, and a gate terminal;
   a seventh transistor comprising a gate terminal configured to receive a fourth pulse signal, a first terminal configured to receive a fifth pulse signal, and a second terminal coupled to a gate terminal of the sixth transistor; and
   an eighth transistor comprising a first terminal coupled to the first driving control signal source, a second terminal coupled to the low voltage terminal, and a gate terminal coupled to the second terminal of the fourth transistor and the second terminal of the sixth transistor, wherein the first pulse signal and the second pulse signal are in phase, and the fourth pulse signal and the fifth pulse signal are in phase; and a main pull-up unit comprising:
  a pull-up control unit coupled to a pulse signal source and the first driving control signal source; and
  a pull-up unit coupled to the pull-up control unit, the pulse signal source, the first gate-terminal signal source and the first driving control signal source, and configured to pull up the first gate-terminal signal.

2. The shift register of claim 1, wherein the first gate-terminal signal source is an nth gate-terminal signal source, the second gate-terminal signal source is an (n+2)th gate-terminal signal source, the third gate-terminal signal source is an (n+6)th gate-terminal signal source, the first setting signal source is an nth setting signal source, the second setting signal source is an (n+2)th setting signal source, the first driving control signal source is an nth driving control signal source, the first driving control signal is an nth driving control signal, the first gate-terminal signal is an nth gate-terminal signal, the second gate-terminal signal is an (n+2)th gate-terminal signal, the third gate-terminal signal is an (n+6)th gate-terminal signal, the first pulse signal is an nth pulse signal, the second pulse signal is an (n+1)th pulse signal, the third pulse signal is an (n+3)th pulse signal, the fourth pulse signal is an (n+6)th pulse signal, the fifth pulse signal is an (n+7)th pulse signal, the first setting signal is an nth setting signal, the pulse signal source is an nth pulse signal source, wherein n is an odd integer larger than zero.

3. The shift register of claim 1, wherein the first gate-terminal signal source is an nth gate-terminal signal source, the second gate-terminal signal source is an (n+2)th gate-terminal signal source, the third gate-terminal signal source is an (n+6)th gate-terminal signal source, the first setting signal source is an nth setting signal source, the second setting signal source is an (n+2)th setting signal source, the first driving control signal source is an nth driving control signal source, the first driving control signal is an nth driving control signal, the first gate-terminal signal is an nth gate-terminal signal, the second gate-terminal signal is an (n+2)th gate-terminal signal, the third gate-terminal signal is an (n+6)th gate-terminal signal, the first pulse signal is an (n−1)th pulse signal, the second pulse signal is an nth pulse signal, the third pulse signal is an (n+3)th pulse signal, the fourth pulse signal is an (n+5)th pulse signal, the fifth pulse signal is an (n+6)th pulse signal, the first setting signal is an nth setting signal, the pulse signal source is an nth pulse signal source, wherein n is an even integer larger than zero.

4. A shift register comprising:
  a first voltage stabilizing unit comprising:
    a first pull-down control unit coupled to a low voltage terminal, a first stabilizing control signal source and a first driving control signal source; and
    a first pull-down unit coupled to the first pull-down control unit, the low voltage terminal, the first driving control signal source, a first gate-terminal signal source and a first setting signal source, and configured to pull a first gate-terminal signal, a first driving control signal and a first setting signal to the low voltage terminal when a first stabilizing control signal is of a high state;
  a second voltage stabilizing unit comprising:
    a second pull-down control unit coupled to the low voltage terminal, a second stabilizing control signal source and the first driving control signal source; and
    a second pull-down unit coupled to the second pull-down control unit, the low voltage terminal, the first driving control signal source, the first gate-terminal signal source and the first setting signal source, and configured to pull the first gate-terminal signal, the first driving control signal and the first setting signal to the low voltage terminal when a second stabilizing control signal is high, wherein the second stabilizing control signal and the first stabilizing control signal are in opposite phase;
  a main pull-down unit comprising:
    a first sub-pull-down unit, coupled to a second gate-terminal signal source, the first driving control signal source and the low voltage terminal, and configured to be controlled by a second gate-terminal signal for pulling down the first driving control signal to the low voltage terminal in a first display mode; and
    a second sub-pull-down unit, coupled to a third gate-terminal signal source, the first driving control signal source and the low voltage terminal, and configured to be controlled by a third gate-terminal signal for pulling down the first driving control signal to the low voltage terminal in a second display mode; and
  a main pull-up unit comprising:
    a pull-up control unit coupled to a pulse signal source and the first driving control signal source; and
    a pull-up unit coupled to the pull-up control unit, the pulse signal source, the first gate-terminal signal source and the first driving control signal source, and configured to pull up the first gate-terminal signal,
  wherein the second sub-pull-down unit is further configured to be controlled by the third gate-terminal signal for pulling the first driving control signal down to the low voltage terminal in the first display mode.

5. The shift register of claim 1, wherein the first sub-pull-down unit is a two-dimensional display pull-down unit, and the second sub-pull-down unit is a three-dimensional display pull-down unit.

6. The shift register of claim 1, wherein the first display mode is a two-dimensional display mode, and the second display mode is a three-dimensional display mode.

7. The shift register of claim 4, wherein
  the first sub-pull-down unit comprises:
    a first transistor comprising a gate terminal configured to receive a first pulse signal, a first terminal configured to receive a second pulse signal, and a second terminal;
    a second transistor comprising a gate terminal coupled to the second terminal of the first transistor, a first terminal, and a second terminal coupled to the low voltage terminal;
    a third transistor comprising a gate terminal coupled to a second setting signal source, a first terminal coupled to the second gate-terminal signal source, and a second terminal coupled to the first terminal of the second transistor; and
    a fourth transistor comprising a gate terminal coupled to the first terminal of the second transistor, a first terminal coupled to the first driving control signal source, and a second terminal coupled to the low voltage terminal; and the second sub-pull-down unit comprises:
  a fifth transistor comprising a gate terminal coupled to the third gate-terminal signal source, a first terminal coupled to the first driving control signal source, and a second terminal coupled to the low voltage terminal;
wherein the first pulse signal and the second pulse signal are in phase in the second display mode.

8. The shift register of claim 7, wherein the first gate-terminal signal source is an nth gate-terminal signal source, the second gate-terminal signal source is an (n+2)th gate-terminal signal source, the third gate-terminal signal source is an (n+6)th gate-terminal signal source, the first setting signal source is an nth setting signal source, the second setting signal source is an (n+2)th setting signal source, the first driving control signal source is an nth driving control signal source, the first driving control signal is an nth driving control signal, the first gate-terminal signal is an nth gate-terminal signal, the second gate-terminal signal is an (n+2)th gate-terminal signal, the third gate-terminal signal is an (n+6)th gate-terminal signal, the first pulse signal is an nth pulse signal, the second pulse signal is an (n+1)th pulse signal, the first setting signal is an nth setting signal, wherein n is an odd integer larger than zero.

9. The shift register of claim 7, wherein the first gate-terminal signal source is an nth gate-terminal signal source, the second gate-terminal signal source is an (n+2)th gate-terminal signal source, the third gate-terminal signal source is an (n+6)th gate-terminal signal source, the first setting signal source is an nth setting signal source, the second setting signal source is an (n+2)th setting signal source, the first driving control signal source is an nth driving control signal source, the first driving control signal is an nth driving control signal, the first gate-terminal signal is an nth gate-terminal signal, the second gate-terminal signal is an (n+2)th gate-terminal signal, the third gate-terminal signal is an (n+6)th gate-terminal signal, the first pulse signal is an (n-1)th pulse signal, the second pulse signal is an nth pulse signal, the first setting signal is an nth setting signal, wherein n is an even integer larger than zero.

10. The shift register of claim 4, wherein
the first sub-pull-down unit comprises:
  a first transistor comprising a gate terminal configured to receive a first pulse signal, a first terminal configured to receive a second pulse signal, and a second terminal;
  a second transistor comprising a gate terminal coupled to the second terminal of the first transistor, a first terminal, and a second terminal coupled to the low voltage terminal;
  a third transistor comprising a gate terminal coupled to a second setting signal source, a first terminal coupled to the gate terminal of the third transistor, and a second terminal coupled to the first terminal of the second transistor;
  a fourth transistor comprising a gate terminal coupled to a third pulse signal source, a first terminal, and a second terminal coupled to the low voltage terminal;
  a fifth transistor comprising a gate terminal coupled to the first terminal of the second transistor, a first terminal coupled to the second gate-terminal signal source, and a second terminal coupled to the first terminal of the fourth transistor; and
  a sixth transistor comprising a gate terminal coupled to the first terminal of the fourth transistor, a first terminal coupled to the first driving control signal source, and a second terminal coupled to the low voltage terminal; and
the second sub-pull-down unit comprises:
  a seventh transistor comprising a gate terminal coupled to the third gate-terminal signal source, a first terminal coupled to the first driving control signal source, and a second terminal coupled to the low voltage terminal;
wherein the first pulse signal and the second pulse signal are in phase in the second display mode.

11. The shift register of claim 10, wherein the first gate-terminal signal source is an nth gate-terminal signal source, the second gate-terminal signal source is an (n+2)th gate-terminal signal source, the third gate-terminal signal source is an (n+6)th gate-terminal signal source, the first setting signal source is an nth setting signal source, the second setting signal source is an (n+2)th setting signal source, the first driving control signal source is an nth driving control signal source, the first driving control signal is an nth driving control signal, the first gate-terminal signal is an nth gate-terminal signal, the second gate-terminal signal is an (n+2)th gate-terminal signal, the third gate-terminal signal is an (n+6)th gate-terminal signal, the first pulse signal is an nth pulse signal, the second pulse signal is an (n+1)th pulse signal, the third pulse signal is an (n+3)th pulse signal, and the first setting signal is an nth setting signal, wherein n is an odd integer larger than zero.

12. The shift register of claim 10, wherein the first gate-terminal signal source is an nth gate-terminal signal source, the second gate-terminal signal source is an (n+2)th gate-terminal signal source, the third gate-terminal signal source is an (n+6)th gate-terminal signal source, the first setting signal source is an nth setting signal source, the second setting signal source is an (n+2)th setting signal source, the first driving control signal source is an nth driving control signal source, the first driving control signal is an nth driving control signal, the first gate-terminal signal is an nth gate-terminal signal, the second gate-terminal signal is an (n+2)th gate-terminal signal, the third gate-terminal signal is an (n+6)th gate-terminal signal, the first pulse signal is an (n-1)th pulse signal, the second pulse signal is an nth pulse signal, the third pulse signal is an (n+3)th pulse signal, and the first setting signal is an nth setting signal, wherein n is an even integer larger than zero.

\* \* \* \* \*